(12) United States Patent
Yamasaki et al.

(10) Patent No.: US 7,122,836 B2
(45) Date of Patent: Oct. 17, 2006

(54) ELECTRO-OPTICAL DEVICE AND ELECTRONIC APPARATUS

(75) Inventors: Yasuji Yamasaki, Chino (JP); Kenichi Takahara, Chino (JP); Takunori Iki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/690,275

(22) Filed: Oct. 22, 2003

(65) Prior Publication Data

US 2005/0029521 A1 Feb. 10, 2005

(30) Foreign Application Priority Data

Oct. 31, 2002 (JP) ............... 2002-318542
Sep. 12, 2003 (JP) ............... 2003-321791

(51) Int. Cl.
*H01L 29/04* (2006.01)

(52) U.S. Cl. ......................... 257/72; 257/59

(58) Field of Classification Search ............ 257/59, 257/71, 72, 91, 98, 294, 435, 659
See application file for complete search history.

(56) References Cited

U.S. PATENT DOCUMENTS 6,636,284 B1  10/2003  Sato ..................... 349/110
2002/0060756 A1  5/2002  Kurashina ............ 349/39

FOREIGN PATENT DOCUMENTS

| JP | A 2001-265253 | 9/2001 |
|---|---|---|
| JP | A-2002-149089 | 5/2002 |
| JP | A 2002-156652 | 5/2002 |
| JP | A-2002-156652 | 5/2002 |
| JP | A 2002-158360 | 5/2002 |
| JP | A 2002-215064 | 7/2002 |
| JP | A 2002-244154 | 8/2002 |
| WO | WO-01/8227341 | 11/2001 |

*Primary Examiner*—Hung Vu
(74) *Attorney, Agent, or Firm*—Oliff & Berridge, PLC

(57) ABSTRACT

An electro-optical device includes: data lines extending in a first direction on a substrate; scanning lines extending in a second direction and intersecting with the data lines; pixel electrodes and thin film transistors disposed corresponding to intersections of the data lines and the scanning lines; storage capacitors electrically connected to the thin film transistors and the pixel electrodes; and a shielding layer disposed between the data lines and the pixel electrodes. One of a pair of electrodes forming the storage capacitor is formed of a multi-layered film containing a low resistance film.

16 Claims, 21 Drawing Sheets

F I G. 2
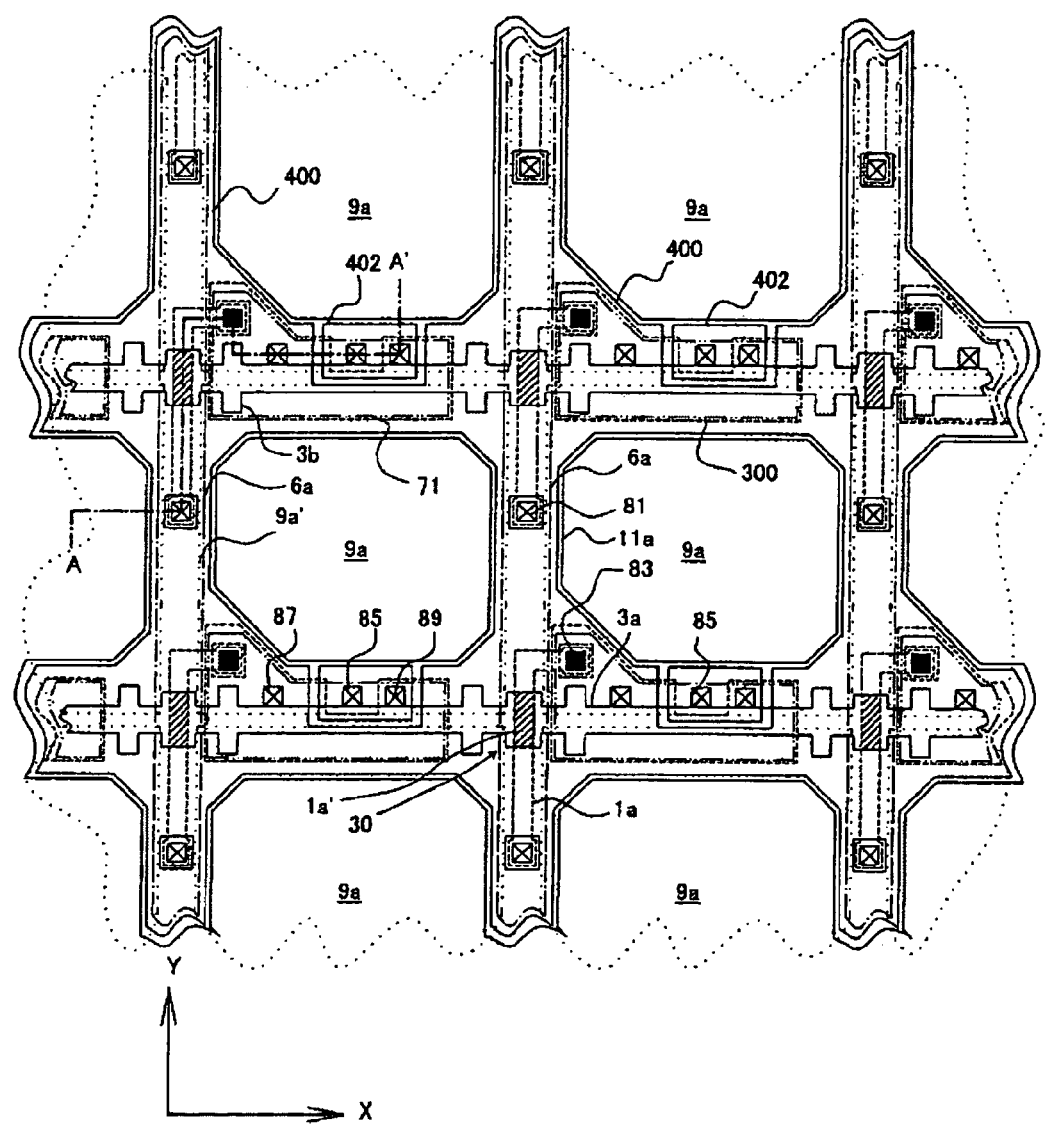

F I G. 1 9
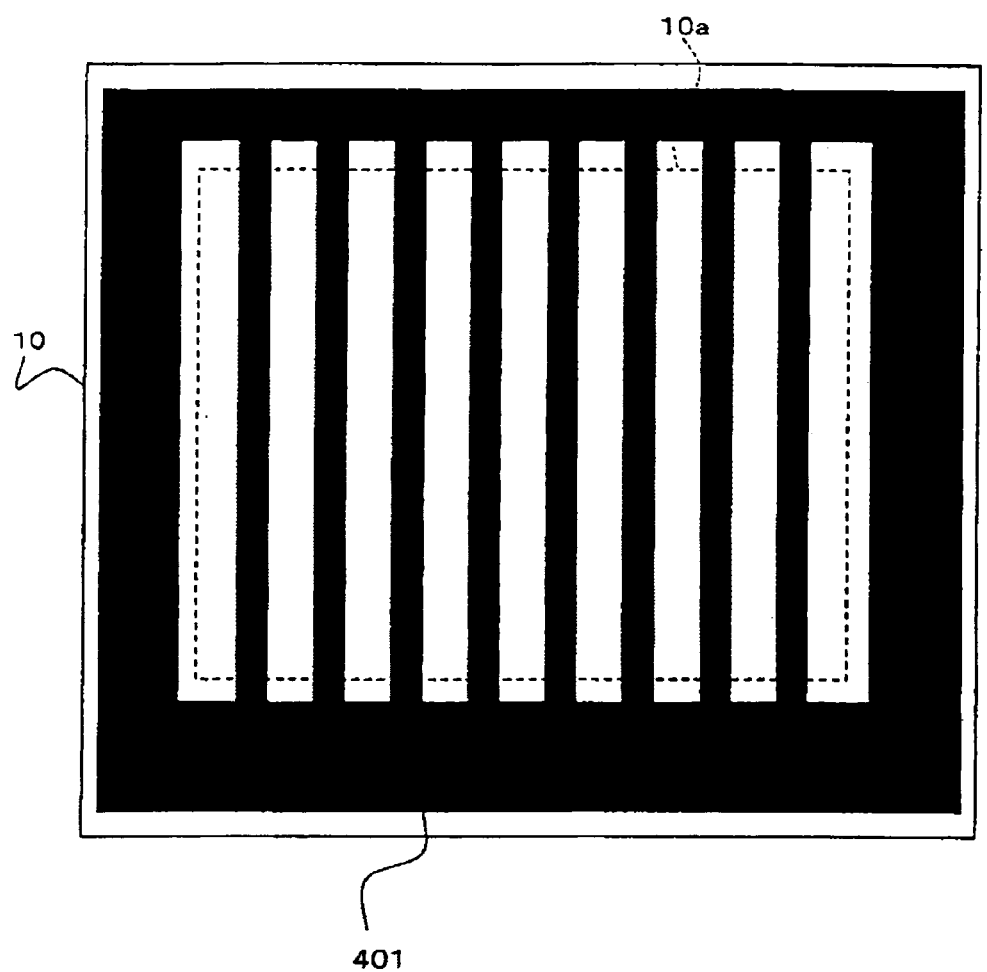

ELECTRO-OPTICAL DEVICE AND ELECTRONIC APPARATUS

BACKGROUND OF THE INVENTION

1. Field of Invention

The present invention relates to active-matrix-driven electro-optical devices. More particularly, the invention relates to an electro-optical device in which thin film transistors (hereinafter sometimes referred to as "TFTs") for switching pixels are provided in a laminated structure on a substrate. The invention also relates to a manufacturing method for such an electro-optical device and to an electronic apparatus provided with the electro-optical device as a light valve. The invention also pertains to electrophoretic devices for, for example, electronic paper, EL (electroluminescent) devices, and devices using electron emission elements (field emission display and surface-conduction electron-emitter display).

2. Description of Related Art

In a TFT-active-matrix-driven electro-optical device, when light is incident on a channel region of a pixel-switching TFT provided for each pixel, a light leakage current is generated due to the optical excitation, which changes the characteristics of the TFT. Particularly in an electro-optical device used as a light valve of a projector, since the intensity of incident light is high, it is important to shield the TFT channel region and the areas therearound from the incident light.

Accordingly, the channel region and the areas therearound are shielded by a light-shielding film, which defines the aperture area of each pixel, provided for an opposing substrate, or by data lines formed of a metal film, such as an Al (aluminum) film, disposed on a TFT array substrate and passing over the TFTs. Additionally, a light-shielding film formed of, for example, a high melting-point metal, is sometimes provided at an opposing position under the TFTs on the TFT array substrate.

By providing a light-shielding film under the TFTs as described above, light reflected by the rear surface of the TFT array substrate, or, if a plurality of electro-optical devices are combined via a prism to form one optical system, returning light of, for example, projection light passing through the prism from another electro-optical device can be prevented from being incident on the TFTs of the electro-optical device.

However, the following problems are presented by the above-described related art light-shielding techniques. According to the technique to form a light-shielding film on the opposing substrate or the TFT array substrate, the spacing between the shielding film and the channel region with, for example, a liquid crystal layer, electrodes, and interlayer insulating film therebetween is three-dimensionally considerably large. Thus, light obliquely applied between the shielding film and the channel region cannot be sufficiently shielded. Particularly in a small electro-optical device used as a light valve of a projector, incident light is a beam of light output from a light source and converged by a lens, and contains obliquely incident light components, which cannot be ignored (for example, 10% components tilted from the direction perpendicular to the substrate by 10 to 15 degrees). Therefore, insufficient shielding for the obliquely incident light presents a problem in a practical sense.

Additionally, light applied to the electro-optical device from an area without the light-shielding film is reflected on the top surface of the substrate, or on the top surface of the light-shielding film formed on the top surface of the substrate, or on the bottom surface of the data lines (namely, the internal surface facing the channel region). Then, such reflected light, or multiple reflection light, if such reflected light is further reflected on the top surface of the substrate or the internal surface of the shielding film or the data lines, sometimes reaches the TFT channel region.

In particular, as the definition of electro-optical devices becomes higher or the pixel pitch becomes smaller in response to recent demands for increasing the quality of display images, the intensity of the incident light is increased in order to display brighter images. Accordingly, it becomes more difficult to provide sufficient light-shielding by the above-described related art light-shielding techniques, and thus, flickering occurs due to a change in the TFT transistor characteristics, thereby reducing the quality of display images.

In order to increase the light-shielding characteristic, it seems that the area in which the light-shielding film is formed can be simply increased. If such an area is increased, however, it is difficult to respond to demands for increasing the aperture ratio of each pixel for enhancing the brightness of display images. As stated above, the internal-surface reflection light or the multiple reflection light resulting from the oblique light is generated by the presence of the light-shielding film, that is, the light-shielding film disposed below the TFTs or the light-shielding film formed of, for example, data lines, disposed above the TFTs. In view of this point, an increased area in which the light-shielding film is formed disadvantageously intensifies the internal-surface reflection light or the multiple reflection light.

SUMMARY OF THE INVENTION

Accordingly, in view of the above problems, an aspect of the present invention provides an electro-optical device which inhibits the generation of a light leakage current by increasing the light-shielding performance for a semiconductor layer of thin-film transistors so as to display high-quality images without flickering. An aspect of the present invention also provides an electronic apparatus provided with such an electro-optical device.

In order to address the above-described objects, an aspect of an electro-optical device of the present invention includes: data lines extending in a first direction above a substrate; scanning lines extending in a second direction and intersecting with the data lines; pixel electrodes and thin film transistors disposed corresponding to intersections of the data lines and the scanning lines; storage capacitors electrically connected to the thin film transistors and the pixel electrodes; and a shielding layer disposed between the data lines and the pixel electrodes. One of a pair of electrodes forming each of the storage capacitors is formed of a multi-layered film containing a low resistance film.

According to an aspect of the electro-optical device of the present invention, one of a pair of electrodes forming each of the storage capacitors (hereinafter sometimes referred to as "first electrode") is formed of a multi-layered film containing a low resistance film.

With this configuration, the functions of the first electrode can be improved (for example, in addition to the function as the fixed-potential capacitor electrode, other functions are provided for the first electrode). In particular, the multi-layered film contains a low resistance film, i.e., a material, for example, a single metal, such as aluminum, copper, or chromium, or a material containing such a single metal, having an electric resistance lower than polysilicon or WSi, which is used in the related art, thereby achieving higher electric conductivity.

In one aspect of the electro-optical device of the present invention, the multi-layered film may be formed of a light-absorbing film as the bottom layer and a light-reflecting film as the top layer.

With this configuration, directly incident light can be reflected by the top layer, and returning light can be absorbed by the bottom layer.

In another aspect of the electro-optical device of the present invention, one of the pair of electrodes forming each of the storage capacitors may form part of a capacitor line formed in the second direction, and the capacitor line may be formed of a multi-layered film containing a low resistance film.

According to this aspect, one of the pair of electrodes forming each of the storage capacitors, i.e., the first electrode defined above, forms part of a capacitor line formed in the second direction, i.e., in the direction in which the scanning lines are formed. With this arrangement, it is not necessary to provide a conductive material to set the first electrode of the storage capacitor, provided for each pixel, to be a fixed potential. Instead, it is sufficient that each capacitor line is connected to a fixed potential source. According to this aspect, therefore, the manufacturing process can be simplified, and the manufacturing cost can be reduced.

Specifically in this aspect, the capacitor line is formed of the above-described multi-layered film containing a low resistance film. With this configuration, the functions of the capacitor line can be enhanced (for example, in addition to the function as the fixed-potential capacitor electrode, other functions can be provided for the capacitor line). In particular, the multi-layered film contains a low resistance film, i.e., a material, for example, a single metal, such as aluminum, copper, or chromium, or a material containing such a single metal, having an electric resistance lower than polysilicon or WSi, which is used in the related art, thereby achieving higher electric conductivity. In this aspect, because of this higher electric conductivity, the size of the capacitor lines, i.e., the size of the storage capacitors, can be reduced without any special restriction. Accordingly, this aspect also greatly contributes to enhancing the aperture ratio. In other words, the occurrence of crosstalk or burning caused by an increased resistance due to a reduced size of the capacitor lines, can be reduced or prevented.

The capacitor line of this aspect is formed of the above-described multi-layered film containing a low resistance film. Accordingly, in addition to the low resistance film, the capacitor line can be formed of another material to implement a light-shielding function to shield the thin film transistor from light.

Additionally, when the capacitor line is formed of a multi-layered film, the functions as the storage capacitor can be stabilized. More specifically, for example, in order to achieve only a low resistance, it is sufficient that the capacitor line is formed of only a single layer containing a low resistance material. However, in this case, the functions as a capacitor inherent in the storage capacitor cannot be sufficiently fulfilled. In an aspect of the present invention, therefore, by forming the capacitor line in two or more films, as stated above, even if a material to provide a special function is used for one layer, another material to fulfill the functions as the storage capacitor can be compensatively provided for another layer. Accordingly, the above-described problems are not addressed.

In an aspect of the present invention, since the above-described multi-functions can be implemented in the capacitor line, the flexibility to design the electro-optical device can be enhanced.

In still another aspect of the electro-optical device of the present invention, the capacitor line has the above-described low resistance film as the top layer and a film containing a light-absorbing material as the bottom layer.

According to this aspect, multi-functions described below can be fulfilled in the capacitor line. Since the top layer of the capacitor line is formed of the above-described low resistance film, light coming from the top layer is reflected on the surface of the low resistance film, thereby reducing or preventing the light from directly reaching the thin film transistor. This is due to the fact that the material forming the top layer generally has a high light-reflecting ratio.

The bottom layer of the capacitor line is formed of a light-absorbing material, such as polysilicon. Accordingly, so-called stray light, generated by being reflected on the surface of the low resistance film or the lower surface of the data line after light is incident on the electro-optical device, can be reduced or prevented from reaching the thin film transistor. That is, such stray light is wholly or partially absorbed in the bottom layer of the capacitor line, thereby decreasing the possibility of stray light reaching the thin film transistor.

In the present invention, it is assumed that the capacitor line is formed of a "multi-layered film". Accordingly in this aspect, for example, even if the capacitor line has aluminum as the top layer and polysilicon as the bottom layer, a film made of another material may be disposed on the aluminum layer, or a film made of another material may be disposed under the polysilicon layer, or a film made of another material may be disposed between the aluminum layer and the polysilicon layer. Alternatively, a structure formed of aluminum, polysilicon, aluminum, from the top, may be formed.

In another aspect of the electro-optical device, the low resistance film may be made of aluminum.

According to this aspect, since aluminum is a very low resistance material, the above-described advantages can be more reliably achieved. The resistance of aluminum is about $\frac{1}{100}$ of the above-described polysilicon or WSi.

According to the above-described configuration in which the capacitor line contains aluminum, the following advantages can also be achieved. In the related art a capacitor line is formed of polysilicon or WSi, as stated above, and thus, a large stress is generated in the interlayer insulating film or the like formed on the capacitor line due to the contraction or compression because of the material. In the present aspect, however, such a problem is not presented. That is, in the related art, a certain restriction is imposed on the thickness of the interlayer insulating film due to the presence of stress, and if the interlayer insulating film is made too thin, it may be broken due to its stress. In this aspect, the presence of such a stress does not have to be considered, and thus, the thickness of the interlayer insulating film can be made smaller than that in the related art, thereby reducing the size of the overall electro-optical device.

In another aspect of the electro-optical device of the present invention, each of the thin film transistors may include a semiconductor layer provided with a channel region extending in the longitudinal direction and channel adjacent regions extending in the longitudinal direction further from the channel region, and a light-shielding portion may be provided at both sides of the channel region. In another aspect of the electro-optical device of the present invention, each of the scanning lines may include: a main portion extending in the direction intersecting with the longitudinal direction and being provided with a gate electrode of the thin film transistor overlapping with the channel region when viewed from the top; and horizontal projections extending in the longitudinal direction from the main portion at both sides of the channel region when viewed from the top so as to form the light-shielding portion.

According to this aspect, the scanning line includes horizontal projections extending along the channel adjacent regions at both sides of the channel region and extending from a main portion provided with the gate electrode of the thin film transistor when viewed from the top. Accordingly, incident light obliquely applied to the surface of the substrate and returning light, and oblique light, such as internal reflection light and multiple reflection light resulting from the incident light or the returning light, can be at least partially prevented from being incident on the channel region and the channel adjacent regions by not only the main portion of the scanning line provided with the gate electrode, but also light absorption or light reflection of the horizontal projections. In this case, light can be blocked particularly by the horizontal projections disposed at a interlayer position away from the channel adjacent regions by a very small interlayer distance, i.e., by the thickness of the gate insulating film, thereby achieving very effective light-shielding.

For example, on the substrate, when the lower light-shielding film is disposed under the thin film transistor, the channel adjacent regions and the channel region can be sandwiched between the lower light-shielding film and the horizontal projections or the main portion of the scanning lines, which functions as the light-shielding film, having a relatively small interlayer distance. Thus, high light-shielding performance for oblique light can be obtained.

As a result, according to this aspect, the light-resistance characteristic can be enhanced, and even under harsh conditions in which high-intensity incident light or returning light is applied, precise switching-control can be performed on the pixel electrodes by the thin film transistors, which have a reduced light leakage current. Thus, bright, high-contrast images can be displayed.

In another aspect of the electro-optical device of the present invention, the main portion and the horizontal projections may be integrally formed as the same film.

According to this aspect, when manufacturing the electro-optical device, the light-shielding projections can be formed together with the main portion in a step to form the scanning lines, and thus, an additional step to form the projections is not necessary, thereby simplifying the laminated structure on the substrate and the manufacturing process.

In another aspect of the electro-optical device of the present invention, the main portion at which the gate electrode is provided may be formed wider.

According to this aspect, since the main portion of the scanning line is made wider at the position at which the gate electrode is formed, the light-shielding performance of the wider main portion for oblique light to be incident on the channel region and the channel adjacent regions can be enhanced. To form a specific part of the main portion to be wider when manufacturing the electro-optical device, only a slight change is made on the planar pattern of the scanning lines, and an additional step is not required.

In the aspect in which the horizontal projections are disposed, the horizontal projections may extend from both sides of the channel adjacent regions that are positioned at source and drain sides of the channel region when viewed from the top.

According to this aspect, a total of four projections are provided for each thin film transistor at the source and drain sides and at positions perpendicular to the source and drain sides. Accordingly, by these projections, the light-shielding performance for oblique light which three-dimensionally comes in various directions can be enhanced.

In another aspect of the electro-optical device of the present invention, each of the thin film transistors may include a semiconductor layer including a channel region extending in the longitudinal direction. An upper light-shielding film to cover the channel region of the thin film transistor at least from the top may be provided. The upper light-shielding film may be at least partially formed in a recessed shape, as viewed from the channel region, in cross section orthogonal to the longitudinal direction of the channel region.

According to this aspect, an upper light-shielding film to cover the channel region at least from the top is provided, and the upper light-shielding film is at least partially formed in a recessed shape, as viewed from the channel region, in cross section orthogonal to the longitudinal direction of the channel region. That is, the upper light-shielding film has a recessed portion at the bottom. With this configuration, compared to when the upper light-shielding film is flat, incident light obliquely applied to the substrate surface, and oblique light, such as the internal reflection light and multiple reflection light resulting from the above incident light or retuned light can be prevented more effectively from being incident obliquely from above on the channel region by the upper light-shielding film.

For example, on the substrate, when the lower light-shielding film is disposed under the thin film transistor, the channel region can be sandwiched between the lower light-shielding film and the upper light-shielding film, thereby making it possible to obtain a very high light-shielding performance for oblique light. In this case, the lower light-shielding film may be at least partially formed in a recessed portion, when viewed from the channel region, in cross section orthogonal to the longitudinal direction of the channel region, in a manner opposite to the upper light-shielding film.

As a result, according to this aspect, the light-resistance characteristic can be enhanced, and even under harsh conditions in which high-intensity incident light or returning light is applied, precise switching-control can be performed on the pixel electrodes by the thin film transistors, which have a reduced light leakage current. Thus, bright, high-contrast images can be displayed.

In another aspect of the electro-optical device of the present invention, each of the thin film transistors includes a semiconductor layer provided with a channel region extending in the first direction. Each of the scanning lines includes a main line portion which is provided with the gate electrode of the thin film transistor disposed to face the channel region with a gate insulating film therebetween and which extends in the second direction intersecting with the first direction when viewed from the top. The scanning line also includes a surrounding portion to surround the semiconductor layer from the main line portion at a position away from the channel region by a predetermined distance in the second direction when viewed from the top.

According to this aspect, the scanning line also includes a surrounding portion to surround the semiconductor layer from the main line portion at a position away from the channel region by a predetermined distance in the second direction when viewed from the top. Accordingly, incident light obliquely applied to the surface of the substrate and returning light, and oblique light, such as internal reflection light and multiple reflection light resulting from the incident light or the returning light, can be at least partially prevented from being incident on the channel region and the channel adjacent regions by not only the main portion of the scanning line provided with the gate electrode, but also light absorption or light reflection of the surrounding portion. In this case, light can be blocked particularly by the surrounding portion disposed at the interlayer position away from the channel region or the channel adjacent regions by a very small interlayer distance, i.e., by the thickness of the gate insulating film, and also light tilted in any direction can be blocked by this surrounding portion, thereby achieving very effective light-shielding.

As a result, according to this aspect, the light-resistance characteristic can be enhanced, and even under harsh conditions in which high-intensity incident light or returning light is applied, precise switching-control can be performed on the pixel electrodes by the thin film transistors, which have a reduced-light leakage current. Thus, bright, high-contrast images can be displayed.

In view of these technical advantages, "to surround the semiconductor layer when viewed form the top" in the present invention is, in a broad sense, to for the surrounding portion continuously around the semiconductor layer when viewed from the top, or to form the surrounding portion under the channel region to surround the semiconductor layer with some breaks when viewed from the top, or to intermittently form the surrounding portion. Alternatively, it means that the surrounding portions are formed to be isolated from each other.

Specifically in this aspect, part of the source region and part of the drain region of the semiconductor layer are formed as areas in which contact holes are formed, and the surrounding portion surrounds the semiconductor layer including such areas in which the contact holes are formed.

With this configuration, the source region or the drain region of the semiconductor layer can be connected to, for example, the data line, the pixel electrode, or the storage capacitor, or to the relay wiring pattern or the relay layer leading to the data line, the pixel electrode, or the storage capacitor via the contact holes. In this case, the light-shielding performance can be enhanced around the areas in which the contact holes are formed by the surrounding portion. Accordingly, even by the provision of the contact holes, highly reliable light-shielding can be performed.

With this configuration, at least one of the source region and the drain region, including the area in which contact hole is formed, is formed to be the same width as the channel region.

With this configuration, the source region or the drain region having the same width as the channel region, including the area in which contact holes is formed, can be entirely surrounded by the surrounding portion, which is rectangular when viewed from the top, at a position relatively close to the source region or the drain region.

Specifically in the aspect in which the surrounding portion is provided, the scanning line may further include a vertical projection extending in the vertical direction of the substrate from the main line portion at a position away from the channel region in the second direction by a predetermined distance.

According to this aspect, the main line portion includes the vertical projection extending in the vertical direction of the substrate. Thus, the channel region can be three-dimensionally covered with the main line portion including the vertical projection, thereby further improving the light-shielding performance. Particularly when the scanning line is a so-called "top gate type" positioned above the channel region, the channel region can be three-dimensionally covered with the main line portion including the vertical projection from above. The predetermined distance from the channel region to the surrounding portion may be the same as or different from that from the channel region to the vertical projection.

Specifically in the aspect in which the surrounding portion is provided, the scanning line may further include a vertical projection extending from the surrounding portion in the perpendicular direction of the substrate.

According to this aspect, the channel region can be three-dimensionally covered with the vertical projection of the main line portion and the vertical projection of the surrounding portion, thereby further enhancing the light-shielding performance. Particularly when the scanning line is a so-called "top gate type" positioned above the channel region, the channel region can be three-dimensionally covered with the main line portion including the vertical projection and the surrounding portion including the vertical projection from the top. The vertical projections may be continuously extended, or they may be separately extended.

According to another aspect of the electro-optical device of the present invention, each of the thin film transistors may include a semiconductor layer including a channel region extending in the first direction. Each of the scanning lines may include a main line portion which is provided with a gate electrode of the thin film transistor disposed to face the channel region with a gate insulating film therebetween and which extends in the second direction intersecting with the first direction when viewed from the top. The scanning line may also include a vertical projection extending downward from the main line portion at a position away from the channel region in the second direction by a predetermined distance when viewed from the top.

According to this aspect, the scanning line includes a vertical projection extending downward from the main line portion at a position away from the channel region in the second direction by a predetermined distance when viewed from the top. Accordingly, incident light obliquely applied to the surface of the substrate and returning light, and oblique light, such as internal reflection light and multiple reflection light resulting from the incident light or the returning light, can be three-dimensionally prevented from being incident on the channel region and the channel adjacent regions by not only the main portion of the scanning line provided with the gate electrode, but also by the main line portion and the projection at the position adjacent to the channel region and channel adjacent regions, thereby implementing very effective light-shielding.

As a result, according to this aspect, the light-resistance characteristic can be enhanced, and even under harsh conditions in which high-intensity incident light or returning light is applied, precise switching-control can be performed on the pixel electrodes by the thin film transistors, which have a reduced light leakage current. Thus, bright, high-contrast images can be displayed.

Specifically in the aspect in which the above-described vertical projection is provided, a lower light-shielding film to cover the channel region at least from the bottom may further be provided on the substrate, and the top of the vertical projection may be in contact with the lower light-shielding film.

With this configuration, the channel adjacent regions and the channel region can be sandwiched between the lower light-shielding film and the surrounding portion and the main portion of the scanning line, which serves as a light-shielding film, having a relatively small interlayer distance therebetween. Additionally, the space between the lower light-shielding film and the surrounding portion and the main portion of the scanning line in which the channel adjacent regions and the channel region are disposed is at least partially closed by the projection. Thus, very high light-shielding performance can be obtained for light tilted in any direction.

According to this aspect, for example, the gate electrode of the thin film transistor and the scanning line may be formed in different layers rather than being formed in the same layer. As the scanning lines, the lower light-shielding film of this aspect can be used. That is, in this case, the lower light-shielding film can also serve as the scanning lines. Alternatively, the lower light-shielding film may serve as the scanning lines while the gate electrodes and the scanning lines are formed in the same layer. In this case, two scanning lines are provided in parallel with each other for each thin film transistor, and thus, a redundant structure is provided for the scanning lines. With this structure, even if a failure, for example, a break, occurs in one scanning line, the other scanning line can be used, thereby enhancing the reliability.

When the lower light-shielding film also serves the functions of the scanning lines, it has to be formed in a striped shape to correspond to each row of the thin film transistors disposed in a matrix.

Alternatively, a lower light shielding film to cover at least the channel region from the bottom may further be provided on the substrate, and the vertical projection is not in contact with the lower light-shielding film.

With this configuration, the channel adjacent regions and the channel region can be sandwiched between the lower light-shielding film and the surrounding portion and the main portion of the scanning line, which serves as a light-shielding film, having a relatively small interlayer distance therebetween. Additionally, the space between the lower light-shielding film and the surrounding portion and the main portion of the scanning line in which the channel adjacent regions and the channel region are disposed is at least partially closed by the projection. Thus, very high light-shielding performance can be obtained for light tilted in any direction.

In the configuration in which the scanning lines are not in contact with the lower light-shielding film, the adverse influence of potential variations in the lower light-shielding film, for example, the adverse influence on the thin film transistors, can be reduced or prevented without being dependent on the conductivity of the lower light-shielding film.

In another aspect of the electro-optical device of the present invention, each of the thin film transistors may include a semiconductor layer provided with a channel region extending in the first direction. Each of the scanning lines may include a main line portion which is provided with a gate electrode of the thin film transistor disposed to face the channel region with a gate insulating film therebetween and which extends in the second direction intersecting with the first direction when viewed from the top. The main line portion may be disposed in a groove formed in the substrate, and also includes an in-groove portion to cover at least part of the channel region from the sides.

According to this aspect, the scanning line includes a main line portion extending in the second direction when viewed from the top. In particular, the in-groove portion of the main line portion disposed in the groove at least partially covers the channel region from the sides. Accordingly, incident light obliquely applied to the surface of the substrate, in particular, returning light obliquely applied to the rear surface, and oblique light, such as internal reflection light and multiple reflection light resulting from the incident light or the returning light, can be at least partially prevented from being incident on the channel region and the channel adjacent regions by light absorption or light reflection by this in-groove portion. The light-resistance characteristic can be enhanced as described above, and even under harsh conditions in which high-intensity incident light or returning light is applied, precise switching-control can be performed on the pixel electrodes by the thin film transistors, which have a reduced light leakage current. Thus, bright, high-contrast images can be displayed.

Additionally, since the main line portion of the scanning line includes the in-groove portion, the cross sectional area of the in-groove portion in vertical cross section in the second direction and the cross sectional area of the out-of-groove portion positioned out of the groove can be increased so as to reduce the wiring resistance of the scanning line. By reducing the wiring resistance of the scanning line, the occurrence of crosstalk or flickering due to the delay of scanning signals can be decreased, thereby making it possible to display high-quality images while achieving increased definition and the smaller pixel pitch of the electro-optical device. As a result, bright, high-quality images can be displayed.

In an aspect of the present invention, the groove in which the main line portion of the scanning line is at least partially disposed may be directly formed in the substrate, or in the underlying insulating layer laminated on the substrate.

In another aspect of the electro-optical device of the present invention, each of the thin film transistors may include a semiconductor layer provided with a channel region extending in the first direction. Each of the scanning lines may include a main line portion, which is provided with a gate electrode of the thin film transistor, disposed to face the channel region with a gate insulating film therebetween and which extends in the second direction intersecting with the first direction when viewed from the top. The main line portion may include an in-groove portion disposed in a groove formed in the substrate and extending in the second direction and an out-of-groove portion disposed out of the groove and extending in the second direction.

According to this aspect, the scanning line has a main line portion extending in the second direction when viewed from the top. In this case, since this main line portion includes an in-groove portion and an out-of-groove portion extending in the second direction, the wiring resistance of the scanning line can be reduced according to a total sectional area of the in-groove portion and the out-of-groove portion in cross section perpendicular to the second direction. For example, due to the poor operation of the electro-optical material, for example, the disordered alignment of the liquid crystal, there is a limitation on the allowable difference of levels on the surface of the substrate that defines the thickness of the layer of an electro-optical material, such as liquid crystal. In view of this point, the structure of an aspect of the present invention, in which the cross sectional area of the scanning lines can be increased with respect to the total thickness in the laminated structure on the substrate, is practically very advantageous over known scanning lines formed on the flat surface or scanning lines entirely embedded in grooves.

By reducing the wiring resistance of the scanning lines, the occurrence of crosstalk or flickering due to the delay of scanning signals can be decreased, thereby making it possible to display high-quality images while achieving increased definition and the smaller pixel pitch of the electro-optical device.

In an aspect of the present invention, the groove in which the main line portion of the scanning line is at least partially disposed may be directly formed in the substrate, or in the underlying insulating layer laminated on the substrate.

As described above, in the aspect in which light-shielding is performed for the semiconductor layer by providing special elements, for example, horizontal projections, surrounding portions, etc., for the scanning lines, the scanning lines are preferably formed of a light-shielding film made of a metal or an alloy.

According to this aspect, the scanning line may be formed of a light-shielding film containing a metal or an alloy, and more specifically, a metal, an alloy, metal siliside, or polysiliside containing at least one of high melting-point metals consisting of Ti (titanium), Cr (chromium), W (tungsten), Ta (tantalum), Mo (molybdenum), and Pb (lead), or a laminated layer of these elements. Accordingly, by the main portion and the projections of the scanning lines formed of such a light-shielding film, the light-shielding performance for shielding the channel region and the channel adjacent regions from oblique light can be enhanced.

However, even if the scanning lines are formed of a polysilicon film rather than the above-described light-shielding film, the light-shielding performance according to the light absorption characteristic can be obtained.

In this aspect, the scanning line has a multi-layered structure of a metal film and a silicon film. With this configuration, the light-shielding performance can be further enhanced.

In another aspect of the electro-optical device of the present invention, at least part of the scanning lines, the data lines, the pair of electrodes forming the storage capacitor, and the shielding layer may be formed of a light-shielding material, and at least part of the scanning lines, the data lines, the pair of electrodes forming the storage capacitor, and the shielding layer formed of the light shielding material may form a built-in light-shielding film in a laminated structure.

According to this aspect, the various elements forming the laminated structure on the substrate are formed of a light-shielding material so as to form a light-shielding film defining the light transmission area. Accordingly, a so-called "built-in light-shielding film" is provided on the substrate, and it is possible to reduce or prevent the occurrence of flickering on images or the like caused by the generation of a light leakage current due to the light incident on the semiconductor layers of the thin film transistors. That is, the light-shielding characteristic for the thin film transistors and the semiconductor layers thereof can be enhanced. If the thin film transistors are formed on the bottommost layer of the substrate or a layer close to the bottommost layer, the scanning lines, the data lines, the storage capacitors, and the shielding layer are formed above the thin film transistors, and thus, a light-shielding film formed of these elements can be referred to as an "upper light-shielding film".

The "light-shielding material" in this aspect is a metal, an alloy, metal siliside, or polysiliside containing at least one of high melting-point metals consisting of Ti (titanium), Cr (chromium), W (tungsten), Ta (tantalum), and Mo (molybdenum), or a laminated layer of these elements. The "light-shielding material" may contain aluminum (Al).

Specifically in this aspect, all the above-described various elements may form the "built-in light-shielding film". Preferably, however, at least one pair of two elements extending in the directions intersecting with each other may form the "built-in light-shielding film". For example, if a capacitor line is formed in the second direction in which the scanning lines are disposed, and if part of the capacitor line is one of a pair of electrodes forming the storage capacitor, it is preferable that the capacitor line and the data lines be formed of a light-shielding material, which forms the "built-in light-shielding film". With this configuration, the shape of the "built-in light-shielding film" is a lattice-like shape, which can be suitably correspond to the form of a matrix, which is usually employed as the arrangement of the pixel electrodes.

In the present invention, various aspects can be employed, as described above. In the present invention, basically, one aspect can be combined with another aspect as desired. However, some combinations are not suitable because of the characteristics of the aspects; for example, the aspect in which horizontal projections are provided for the scanning lines cannot be combined with the aspect in which the capacitor line is formed of a multi-layered film including a low resistance film. It is, of course, possible to form an electro-optical device having three or more aspects.

In order to address the above-described objects, another aspect of an electro-optical device of the present invention includes: data lines extending in a first direction above a substrate; scanning lines extending in a second direction and intersecting with the data lines; pixel electrodes and thin film transistors disposed corresponding to intersections of the data lines and the scanning lines; storage capacitors electrically connected to the thin film transistors and the pixel electrodes; and a light-shielding film disposed between the data lines and the pixel electrodes. One of a pair of electrodes forming the storage capacitor is formed of a multi-layered film containing a low resistance film.

This electro-optical device of the present invention has a configuration similar to that of the previous electro-optical device of the present invention, and thus, advantages similar to those obtained by the previous electro-optical device can be enjoyed. Specifically in an aspect of this invention, instead of the shielding layer provided for the previous electro-optical device, the light-shielding film is provided. Thus, light coming from above the thin film transistors can be effectively blocked, thereby reducing or preventing the generation of a light leakage current in the semiconductor layers of the thin film transistors.

In order to address the above-described objects, an aspect of an electronic apparatus of the present invention includes the above-described electro-optical device of the present invention. The various aspects can be possible for the electro-optical device.

According to an aspect of the electronic apparatus of the present invention, since the above-described as an aspect of electro-optical device of the present invention is provided, light can be blocked from the semiconductor layers of the thin film transistors. Thus, it is possible to implement various electronic apparatuses, such as projection display devices, liquid crystal televisions, cellular telephones, electronic diaries, wordprocessors, view-finder or monitor-direct-view video cassette recorders, workstations, videophones, POS terminals, touch panels, etc., that can display high-quality images almost without the occurrence of flickering on images due to a light leakage current.

The above-described operations and other advantages of the aspect of the present invention are to be apparent from the following description of the exemplary embodiments.

BRIEF DESCRIPTION OF THE DRAWINGS

FIG. 2 is a plan view illustrating a plurality of pixel groups adjacent to each other having data lines, scanning lines, and pixel electrodes formed thereon on the TFT array substrate in the electro-optical device of the first exemplary embodiment of the present invention.

FIG. 19 is a plan view illustrating the arrangement of a nitride film (formed as the top layer of data lines and around the image display area).

DETAILED DESCRIPTION OF PREFERRED EMBODIMENTS

Exemplary embodiments of the present invention are described below with reference to the drawings. In the following exemplary embodiments, an electro-optical device of the present invention is applied to a liquid crystal device.

First Exemplary Embodiment

Figure 1:
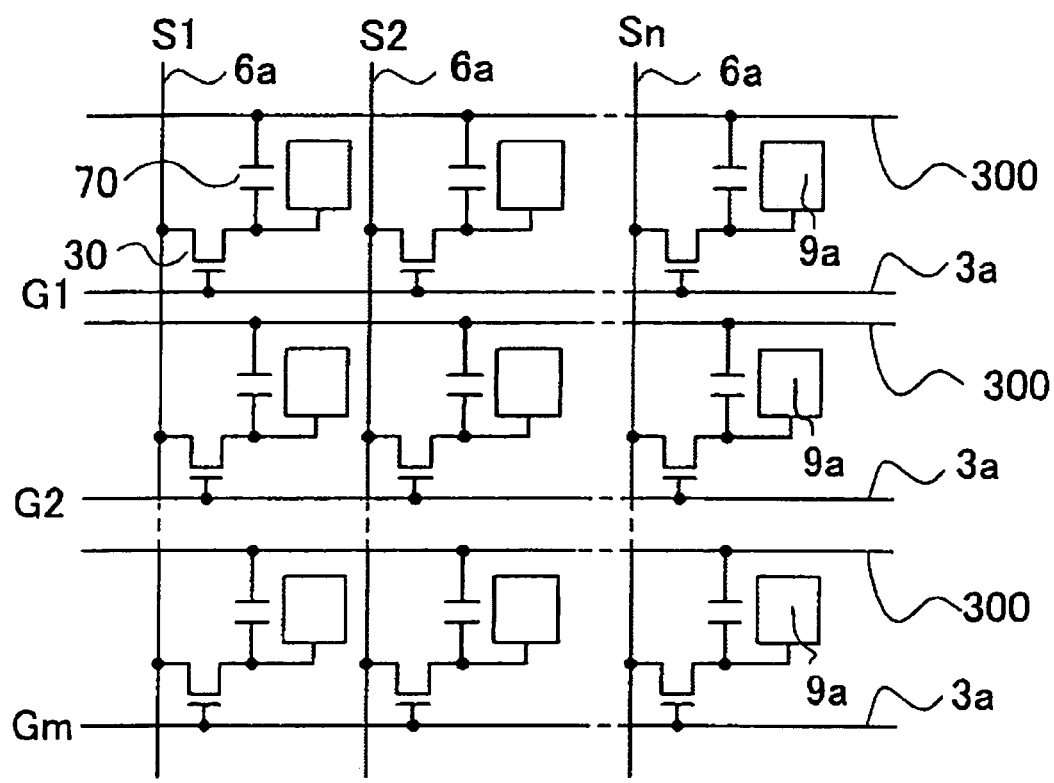
FIG. 1 is an equivalent circuit schematic illustrating various elements, wiring patterns, etc., provided for a plurality of pixels formed in a matrix which form an image display area of an electro-optical device according to a first exemplary embodiment of the present invention.
Figure 3:
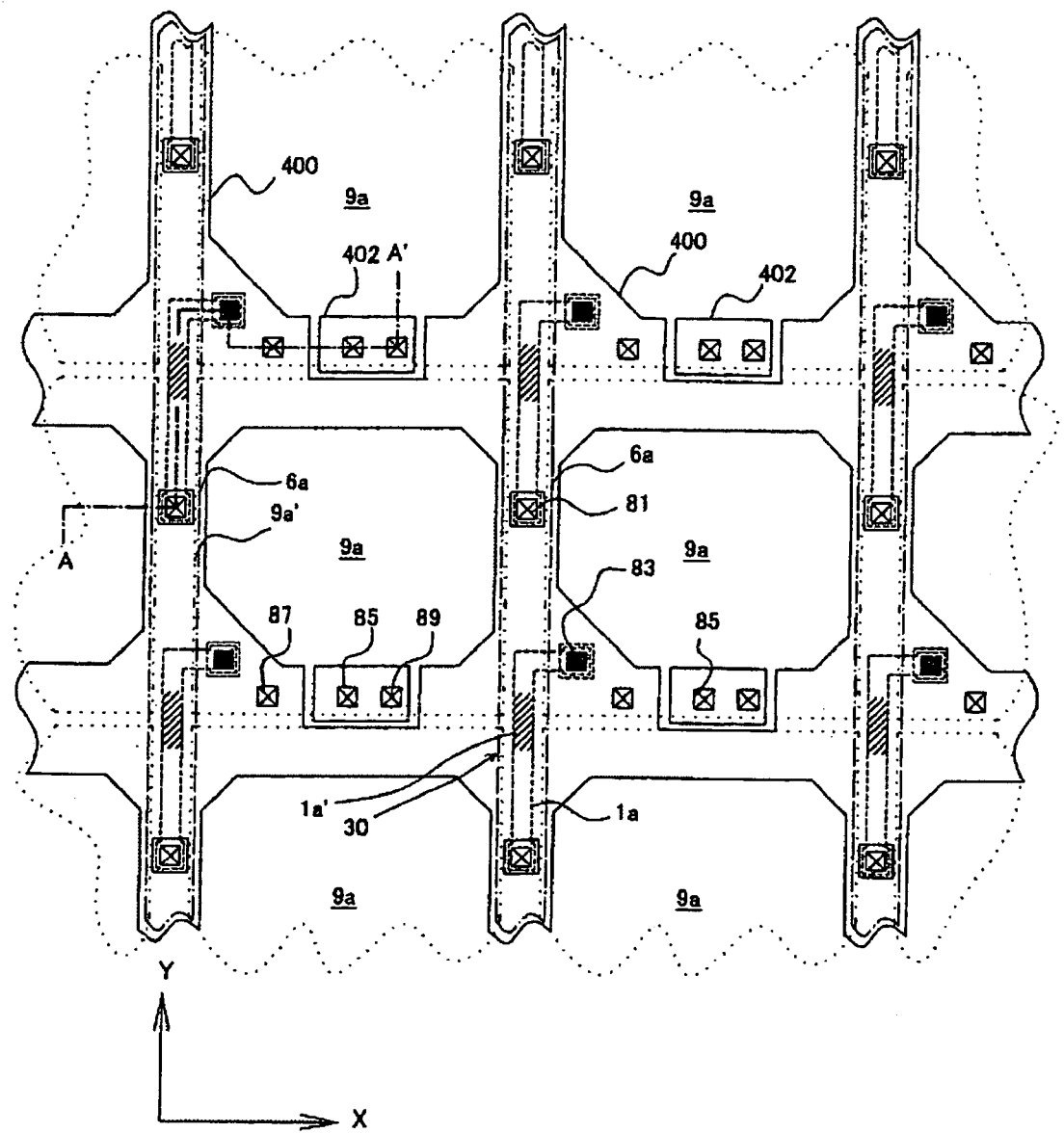
FIG. 3 is a plan view illustrating essential portions extracted from the electro-optical device shown in FIG. 2.
Figure 4:
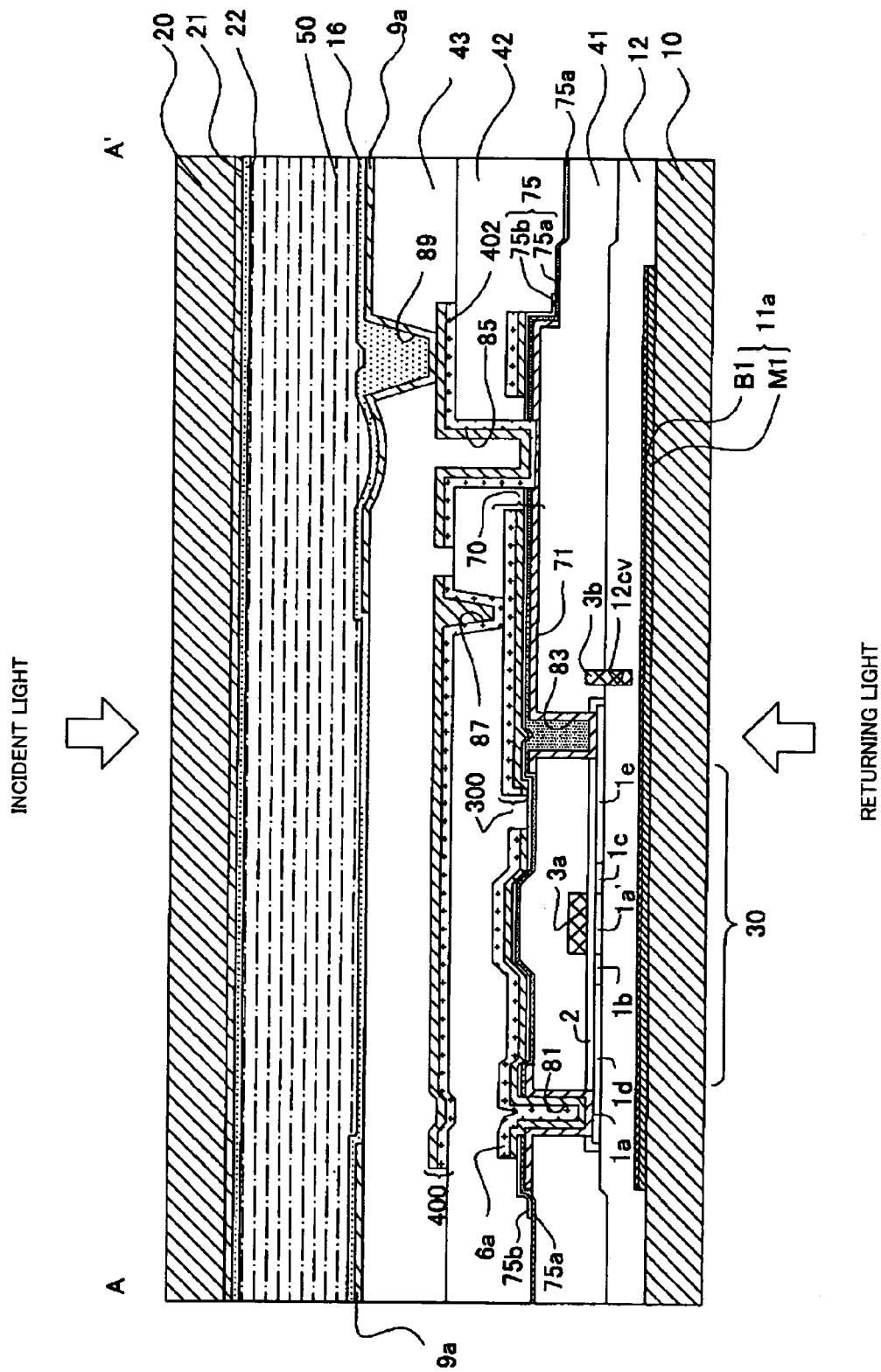
FIG. 4 is a sectional view taken along plane A–A' of FIG. 2.

The configuration of a pixel portion of an electro-optical device according to a first exemplary embodiment is described below with reference to FIGS. 1 through 4. FIG. 1 illustrates an equivalent circuit of various elements, wiring patterns, etc., in a plurality of pixels formed in a matrix, which forms an image display area of the electro-optical device. FIG. 2 is a plan view illustrating a plurality of pixel groups disposed adjacent to each other having data lines, scanning lines, pixel electrodes, etc. thereon on a TFT array substrate. FIG. 3 is a plan view illustrating the essential portion extracted from the pixel groups shown in FIG. 2, in order to show the positional relationship among the data lines, the shielding layer, and the pixel electrodes. FIG. 4 is a sectional view taken along plane A–A' of FIG. 2. In FIG. 4, the scales of the individual layers and the individual elements are different in order to easily identify the sizes of the layers and elements.

In FIG. 1, the plurality of pixels formed in a matrix, which form the image display area of the electro-optical device of this exemplary embodiment, are provided with pixel electrodes 9a and TFTs 30 for controlling the switching of the pixel electrodes 9a. Data lines 6a, to which image signals are supplied, are electrically connected to the sources of the TFTs 30. Image signals S1, S2, . . . , Sn may be sequentially and individually supplied to the corresponding data lines 6a in that order, or may be supplied to a plurality of adjacent data lines 6a in groups.

Scanning lines 3a are electrically connected to the gates of the TFTs 30, and scanning signals G1, G2, . . . , Gm are sequentially and individually applied to the corresponding scanning lines 3a line by line in a pulse manner with a predetermined timing. The pixel electrodes 9a are electrically connected to the drains of the TFTs 30, and by closing the switches of the TFTs 30, which serve as switching elements, for a predetermined period of time, the image signals S1, S2, . . . , Sn supplied from the data lines 6a are written into the pixel electrodes 9a with a predetermined timing.

The image signals S1, S2, . . . , Sn having predetermined levels written into liquid crystal, which is one example of an electro-optical material, via the pixel electrodes 9a are retained between the liquid crystal and a common electrode formed on the opposing substrate for a predetermined period of time. The alignment and order of molecular groups of the liquid crystal are changed according to the voltage level applied so as to modulate light, thereby making it possible to display a grayscale. In the normally white mode, the transmission factor for incident light is decreased according to the voltage applied to each pixel, and in normally black mode, the transmission factor for incident light is increased according to the voltage applied to each pixel. On the whole, light having a contrast level according to the image signals is emitted from the electro-optical device.

In order to reduce or prevent leakage of the retained image signals, storage capacitors 70 are added in parallel to liquid crystal capacitors formed between the pixel electrodes 9a and the common electrodes. The storage capacitors 70 are disposed in parallel with the scanning lines 3a, and include fixed-potential capacitor electrodes and also include capacitor electrodes 300 fixed at a constant potential.

The actual configuration of the electro-optical device formed of the data lines 6a, the scanning lines 3a, the TFTs 30, etc., in which the above-described circuit operation is implemented is described below with reference to FIGS. 2 through 4.

In FIG. 2, the plurality of pixel electrodes 9a (outlines are indicated by broken lines 9a') are formed in a matrix on a TFT array substrate 10, and the data lines 6a and the scanning lines 3a are provided along the vertical and horizontal boundaries of the pixel electrodes 9a. The data lines 6a are formed of a laminated structure containing an aluminum film, as described below, and the scanning lines 3a are formed of, for example, a conductive polysilicon film. The scanning lines 3a are disposed to face channel-regions 1a', which are indicated by lines slanted upward to the right, of semiconductor layers 1a, and serve as the gate electrodes. That is, the pixel-switching TFT 30 in which the main line portion of the scanning line 3a faces the channel region 1a' as the gate electrode is provided at each intersection of the scanning lines 3a and the data lines 6a.

As shown in FIG. 4, which is a sectional view taken along plane A–A' of FIG. 2, the electro-optical device is provided with the TFT array substrate 10 formed of, for example, a quartz substrate, a glass substrate, or a silicon substrate, and an opposing substrate 20, which is positioned to oppose the TFT array substrate 10, formed of, for example, a glass substrate or a quartz substrate.

As shown in FIG. 4, the pixel electrodes 9a are provided for the TFT array substrate 10, and an alignment film 16 subjected to a predetermined alignment treatment, such as rubbing, is provided on the pixel electrodes 9a. The pixel electrodes 9a are formed of a transparent conductive film, such as an ITO film. A common electrode 21 is formed on the entire surface of the opposing substrate 20. An alignment film 22 subjected to a predetermined alignment treatment, such as rubbing, is provided under the common electrode 21. As in the above-described pixel electrodes 9a, the common electrode 21 is formed of a transparent conductive film, such as an ITO film, and the above-described alignment films 16 and 22 are formed of a transparent organic film, such as a polyimide film. Between the TFT array substrate 10 and the opposing substrate 20 disposed to face each other as described above, an electro-optical material, such as liquid crystal, is sealed in a space surrounded by a sealing material (see FIGS. 20 and 21), which is described below, thereby forming a liquid crystal layer 50. The liquid crystal layer 50 is placed in a predetermined alignment state by the alignment films 16 and 22 while an electric field is not applied from the pixel electrodes 9a. The liquid crystal layer 50 is made of, for example, an electro-optical material formed by mixing one or a plurality of nematic liquid crystals. The sealing material is an adhesive made of, for example, light curing resin or thermosetting resin, for laminating the TFT substrate 10 and the opposing substrate 20 at the periphery thereof, and spacers, such as glass fibers or glass beads, are inserted to provide a predetermined distance between the two substrates.

On the TFT array substrate 10, not only the above-described pixel electrodes 9a and alignment film 16, but also other elements are formed in a laminated structure including the pixel electrodes 9a and the alignment film 16. The laminated structure is formed of, as shown in FIG. 4, sequentially starting from the TFT array substrate 10, a first layer including a lower light-shielding film 11a, a second layer including the TFTs 30 and the scanning lines 3a, a third layer including the storage capacitors 70 and the data lines 6a, a fourth layer including a shielding layer 400, and a fifth layer (uppermost layer) including the pixel electrodes 9a and the alignment film 16. An underlayer insulating film 12 is disposed between the first layer and the second layer, a first interlayer insulating film 41 is disposed between the second layer and the third layer, a second interlayer insulating film 42 is disposed between the third layer and the fourth layer, and a third interlayer insulating film 43 is disposed between the fourth layer and the fifth layer. With this arrangement, short-circuiting between the layers can be reduced or prevented. These insulating films 12, 41, 42, and 43 are provided with, for example, contact holes for electrically connecting a high-density source region 1d of the semiconductor layer 1a of the TFT 30 with the data lines 6a. The above-described elements are described below sequentially from the bottom of the laminated structure.

The first layer is provided with the lower light-shielding film 11a. This lower light-shielding film 11a is patterned in the form of a lattice when viewed from the top, thereby defining the aperture area of each pixel (see FIG. 2). In the lower light-shielding film 11a corresponding to the intersections between the scanning lines 3a and the data lines 6a, projections to chamfer the corners of the pixel electrodes 9a are formed.

In this exemplary embodiment, this lower light-shielding film 11a has a double layered structure, i.e., a metal layer M1, as the bottom layer and a barrier layer B1 to prevent the oxidization of the metal layer M1 as the top layer. With this arrangement, in this laminated structure, even if a high-temperature treatment (for example, annealing when forming the TFTs 30, which is described below) is performed when forming the elements to be disposed on the lower light-shielding film 11a, the oxidation of the metal layer M1 can be reduced or prevented since the barrier layer B1 is provided as the top layer. The lower light-shielding film 11a is desirably extended circumferentially from the image display area to be connected to a constant potential source in order to reduce or prevent potential variations of the lower light-shielding film 11a from adversely influencing the TFTs 30.

As the second layer, the TFTs 30 and the scanning lines 3a are provided. The TFT 30 has a LDD (Lightly Doped Drain) structure, as shown in FIG. 4, and is provided with the scanning line 3a, which serves as the gate electrode, as stated above, the channel region 1a' of the semiconductor layer 1a, which is made of, for example, polysilicon film, and whose channel is formed by an electric field from the scanning line 3a, an insulating film 2 including a gate insulating film to insulate the scanning line 3a from the semiconductor layer 1a, a low-density source region 1b, a low-density drain region 1c, the high-density source region 1d, and a high-density drain region 1e in the semiconductor layer 1a.

It is preferable that the TFT 30 has an LDD structure, as shown in FIG. 4. However, the TFT 30 may have an offset structure in which impurities are not implanted into the low-density source region 1b and the low-density drain region 1c. Alternatively, the TFT 30 may be a self-aligned TFT in which high-density impurities are implanted into the TFT 30 by using the gate electrode formed by part of the scanning line 3a as a mask so as to form a high-density source region and a high-density drain region in a self-aligned manner. In this exemplary embodiment, a single gate structure is formed in which only one gate electrode of the pixel-switching TFT 30 is disposed between the high-density source region 1d and the high-density drain region 1e. However, two or more gate electrodes may be disposed. If a TFT is formed in a multi-gate structure, such as a dual gate structure or a triple gate structure, a leakage current at the junction between the channel and each of the source region and the drain region can be reduced or prevented, thereby making it possible to reduce the current when the TFT is OFF. The semiconductor layer 1a forming the TFT 30 may be a non-monocrystal layer or a monocrystal layer. The monocrystal layer may be formed by a known technique, for example, laminating. By forming the semiconductor layer 1a as a monocrystal layer, the performance of, in particular, peripheral circuits, can be enhanced.

The underlayer insulating film 12 made of, for example, a silicon oxide film, is disposed on the above-described lower light-shielding film 11a and under the above-described TFT 30. The underlying insulating film 12 has the function of insulating the lower light-shielding film 11a from the TFT 30. Since the underlying insulating film 12 is formed on the entire surface of the TFT array substrate 10, it also has the function of reducing or preventing the TFT array substrate 10 from becoming rough when being surface-polished or reducing or preventing the characteristics of the pixel-switching TFT 30 from being changed due to staining after being cleaned.

Specifically in this exemplary embodiment, the underlying insulating film 12 is provided with grooves 12cv (formed in the shape of a contact hole), having the same width as the channel length or a longer depth than the channel length, formed at both sides of the semiconductor layer 1a when viewed from the top. The scanning line 3a laminated on the grooves 12cv includes recessed portions along the grooves 12cv (which is not shown in FIG. 2 for simple representation, see FIG. 5). Since the scanning line 3a is formed to fill in the entirety of the grooves 12cv, horizontal projections 3b, which are integrally formed with the scanning line 3a, are extended. Accordingly, the semiconductor layer 1a of the TFT 30 is covered from the sides when viewed from the top, as shown in FIG. 2, thereby reducing or preventing light from being incident at least from these portions. The horizontal projection 3b may be provided only at one side of the semiconductor layer 1a. Details of the grooves 12cv, and the scanning line 3a and the horizontal projections 3b, which are laminated on the grooves 12cv, are given below with reference to FIGS. 5 through 8.

After the second layer, the storage capacitors 70 and the data lines 6a are provided for the third layer. The storage capacitor 70 is formed of a first relay layer 71 and the capacitor electrode 300 such that they face each other via a dielectric film 75. The first relay layer 71 serves as the pixel-potential capacitor electrode electrically connected to the high-density drain electrode 1e of the TFT 30 and the pixel electrode 9a. The capacitor electrode 300 serves as the fixed-potential capacitor electrode. By the provision of the storage capacitor 70, the potential retaining characteristic of the pixel electrode 9a can be considerably increased. As is seen from the plan view of FIG. 2, the storage capacitor 70 according to this exemplary embodiment is formed outside the light-transmitting region substantially corresponding to the area in which the pixel electrode 9a is formed; in other words, the storage capacitor 70 is formed within the light-shielding area. That is, the storage capacitor 70 is formed in the area in which the portion between adjacent data lines 6a is overlapped with the scanning line 3a, and at the intersection between the scanning line 3a and the data line 6a at which the lower shielding film 11 chamfers the corners of the pixel electrode 9a. With this arrangement, a considerably large pixel aperture ratio for the overall electro-optical device can be maintained, thereby making it possible to display brighter images.

More specifically, the first relay layer 71 is made of, for example, a conductive polysilicon film, and serves as the pixel-potential capacitor electrode. The first relay layer 71 may be formed of a single layered film or a multi-layered film containing a metal or an alloy. If it is formed of a multi-layered film, it is preferable that a light-absorbing, conductive polysilicon film be used as the bottom layer, and a light-reflective metal or alloy be used as the top layer. The first relay layer 71 not only serves as the pixel-potential capacitor electrode, but also has the function of relay-connecting the pixel electrode 9a with the high-density drain region 1e of the TFT 30 via contact holes 83, 85, and 89. The first relay layer 71 has, as shown in FIG. 2, substantially the same configuration as the planar configuration of the capacitor electrode 300, which is described below.

The capacitor electrode 300 serves as the fixed-potential capacitor electrode of the storage capacitor 70. In the first exemplary embodiment, the capacitor electrode 300 is set to be a fixed potential by being electrically connected to the shielding layer 400, which is set to be a fixed potential, via a contact hole 87.

As described below, however, in a mode in which the capacitor electrode 300 and the data line 6a are formed as different layers, it is preferable that the capacitor electrode 300 be maintained at a fixed potential by being extended from an image display area 10a in which the pixel electrode 9a is disposed and then being electrically connected to a constant potential source. The "constant potential source" described above may be, for example, a positive power source or a negative power source supplied to a data-line drive circuit 101, or a constant potential source supplied to the common electrode 21 of the opposing substrate 20.

Specifically in this exemplary embodiment, the data line 6a is formed together with the capacitor electrode 300 as the same film. The "same film" means that two elements are formed as the same layer or are simultaneously formed in the manufacturing process. It should be noted, however, that the capacitor electrode 300 and the data line 6a are not continuously formed in a plane; rather patterning is conducted so that they are divided.

More specifically, as shown in FIG. 2, the capacitor electrode 300 is formed such that it overlaps with the area in which the scanning line 3a is formed, i.e., such that it is divided in the X direction in FIG. 2. The data line 6a is formed such that it overlaps with the length of the semiconductor layer 1a, i.e., such that it is extended in the Y direction in FIG. 2. More specifically, the capacitor electrode 300 is provided with a main line portion extending along the scanning line 3a, a projecting portion (indicated generally a trapezoidal shape in FIG. 2) extending upward along the semiconductor layer 1a in the area adjacent to the semiconductor layer 1a in FIG. 2, and a pit portion formed in accordance with the contact hole 85, which is described below. Among these elements, the projecting portion increases the area in which the storage capacitor 70 is formed.

In contrast, the data line 6a has a main line portion linearly extending in the Y direction of FIG. 2. The high-density drain region 1e positioned at the top end of the semiconductor layer 1a in FIG. 2 is formed to bend at right angles to the right side, such that it overlaps with the projecting portion of the storage capacitor 70. A reason for this arrangement is to establish an electrical connection between the semiconductor layer 1a and the storage capacitor 70 by avoiding the data line 6a (see FIG. 4).

In this exemplary embodiment, to implement the above-described configuration, patterning is conducted to simultaneously form the capacitor electrode 300 and the data line 6a.

The capacitor electrode 300 and the data line 6a are formed as a film having a double layered structure, as shown in FIG. 4, i.e., having a bottom layer made of conductive polysilicon and a top layer made of aluminum. The data line 6a is electrically connected to the semiconductor layer 1a of the TFT 30 via a contact hole 81 passing through the opening of the dielectric film 75, which is described below. However, since the data line 6a has the above-described double structure, and since the above-described first relay layer 71 is formed of a conductive polysilicon film, electrical connection between the data line 6a and the semiconductor layer 1a is established, in actuality, by the conductive polysilicon film. That is, electrical connection is established sequentially, starting from the bottom, by the polysilicon film of the first relay layer 71, the polysilicon film of the bottom layer of the data line 6a, and the aluminum film of the top layer of the data line 6a. Accordingly, good electrical connection can be maintained between the data line 6a and the semiconductor layer 1a. In this exemplary embodiment, the data line 6a and the capacitor electrode 300 are formed of a double layered structure, i.e., a conductive polysilicon layer and an aluminum layer. However, they may be formed of a triple layered structure, i.e., a conductive polysilicon layer, an aluminum layer, and a titanium nitride layer, from the bottom.

With this configuration, the titanium nitride layer serves as a barrier metal to prevent the contact hole 87 from intruding into the capacitor electrode 300 and the data line 6a when forming the contact hole 87 by etching.

The capacitor electrode 300 and the data line 6a contain aluminum, which exhibits a relatively high light-reflection characteristic, and also contain polysilicon, which exhibits a relatively high light-absorbing characteristic, thereby serving as a light-shielding layer. That is, by the capacitor electrode 300 and the data line 6a, it is possible to block light to be incident on the semiconductor layer 1a of the TFT 30 from above (see FIG. 4).

The dielectric film 75 is formed of, as shown in FIG. 4, a relatively thin silicon oxide film having a thickness of, for example, about 5 to 200 nm, such as HTO (High Temperature Oxide) film or a LTO (Low Temperature Oxide) film, or a silicon nitride film. In order to increase the capacitance of the storage capacitor 70, a thinner dielectric film 75 is desirable as long as the reliability of the film can be sufficiently ensured. Specifically in this exemplary embodiment, as shown in FIG. 4, the dielectric film 75 has a double layered structure, i.e., as a silicon oxide film 75a as the bottom layer and a silicon nitride film 75b as the top layer. Patterning is conducted so that the silicon nitride film 75b as the top layer is contained within the light-shielding area (non-aperture area). Accordingly, because of the presence of the silicon nitride film 75b, which has a relatively large dielectric constant, the capacitance of the storage capacitor 70 can be increased. Also, in spite of the increased capacitance, the withstand voltage of the storage capacitor 70 is not decreased because of the presence of the silicon oxide film 75a. Thus, by forming the dielectric film 75 as a double layered structure, two inconsistent advantages can be enjoyed. Patterning is conducted so that the silicon nitride film 75b, which exhibits coloring characteristics, is not formed in a light-transmitting area, thereby making it possible to maintain a high transmission factor. Additionally, because of the presence of the silicon nitride film 75b, water can be prevented from entering the TFT 30.

In this exemplary embodiment, therefore, the threshold voltage of the TFT 30 is not increased, and the device can be operated for a considerably long period of time. Although in this exemplary embodiment the dielectric film 75 has a double layered structure, it may be another type of multi-layered film, for example, a triple layered structure, such as a silicon oxide film, a silicon nitride film, and a silicon oxide film.

A silicate glass film, such as NSG (non silicate glass), PSG (phosphorus silicate glass), BSG (boron silicate glass), or BPSG (boron phosphorus silicate glass), a silicon nitride film, a silicon oxide film, or the first interlayer insulating film 41 preferably made of NSG, is formed on the above-described TFT 30 and scanning line 3a and under the storage capacitor 70 and the data line 6a. The contact hole 81 for electrically connecting the high-density source region 1d of the TFT 30 with the data line 6a is formed in the first interlayer insulating film 41. The contact hole 83 for electrically connecting the high-density drain region 1e of the TFT 30 with the first relay layer 71 forming the storage capacitor 70 is also formed in the first interlayer insulating film 41.

The above-described dielectric film 75 is not formed in the area in which the contact hole 81 is formed. In other words, an opening is formed in the dielectric film 75. This is because electrical connection must be established between the high-density source region 1d and the data line 6a via the first relay layer 71 through the contact hole 81. By providing such an opening in the dielectric film 75, when hydrogenation is performed on the semiconductor layer 1a of the TFT 30, hydrogen, which is used in various process, can easily reach the semiconductor layer 1a via this opening.

In this exemplary embodiment, the first interlayer-insulating film 41 may be fired at about 1000° C., thereby activating ions implanted into the polysilicon film forming the semiconductor layers 1a or the scanning lines 3a.

After the above-described third layer, the shielding layers 400, exhibiting a light-shielding characteristic, are formed in the fourth layer. The shielding layers 400 are formed in a lattice, as shown in FIGS. 2 and 3 when viewed from the top, while extending in the X direction and in the Y direction in FIG. 2. The portion of the shielding layer 400 extending in the Y direction in FIG. 2 is formed to cover the data line 6a and is formed wider than the data line 6a. The portion of the shielding layer 400 extending in the X direction in FIG. 2 has a notch around the center of one side of the pixel electrode 9a in order to reserve an area in which a third relay electrode 402, which is described below, is to be formed. At the corner of the intersection between the portions of the shielding layer 400 extending in the X and Y directions in FIG. 2, a portion generally a triangular shape is provided in accordance with the projecting portion, formed in a generally trapezoidal shape, of the capacitor electrode 300. The width of the shielding layer 400 may be the same as the lower light-shielding film 11a, or it may be larger or smaller than the lower light-shielding film 11a.

The shielding layer 400 is extended circumferentially from the image display area 10a in which the pixel electrode 9a is disposed, and is electrically connected to a constant potential source, thereby being set to be a fixed potential. The "constant potential source" described above may be, for example, a positive power source or a negative power source supplied to the data-line drive circuit 10, or it may be a constant potential source supplied to the common electrode 21 of the opposing substrate 20.

The shielding layer 400 is formed to cover the entire data line 6a (see FIG. 3), and also, because of the presence of the shielding layer 400 maintained at a fixed potential, the influence of capacitive coupling between the data line 6a and the pixel electrode 9a can be eliminated. That is, a potential change of the pixel electrode 9a, caused by the current supply to the data line 6a, can be reduced or prevented, thereby reducing the possibility of images displayed along the data lines 6a being non-uniform. In this exemplary embodiment, because of the lattice form of the shielding layers 400, excessive coupling can be reduced or prevented for the extended portions of the scanning lines 3a. Because of the portion formed in a triangular shape in the shielding layer 400, the influence of capacitive coupling between the capacitive electrode 300 and the pixel electrode 9a can be eliminated. This also contributes to advantages similar to those described above.

The fourth layer is provided with a second relay layer 402, which is one example of the "relay layers" in the present invention, formed together with the shielding layer 400 as the same film. The second relay layer 402 has the function of relaying an electrical connection between the first relay layer 71 forming the storage capacitor 70 and the pixel electrode 9a via the contact hole 89, which is described below. As in the above-described capacitor electrode 300 and the data line 6a, the shielding layer 400 and the second relay layer 402 are not continuously formed in a plane; rather patterning is conducted so that they are divided.

The shielding layer 400 and the second relay layer 402 have a double layered structure including an aluminum layer as the bottom layer and a titanium nitride layer as the top layer. With this configuration, the titanium nitride layer advantageously serves as a barrier metal to prevent the contact hole 89 from intruding into the shielding layer 400 and the second relay layer 402 when forming the contact hole 89 by etching. In the second relay layer 402, the aluminum layer as the bottom layer is connected to the first relay layer 71 forming the storage capacitor 70, and the titanium nitride layer as the top layer is connected to the pixel electrode 9a made of, for example, ITO. In this case, in particular, good connection between the titanium nitride layer and the pixel electrode 9a can be established. In contrast, if the aluminum layer and the pixel electrode 9a formed of, for example, ITO are directly connected, electrolytic corrosion occurs therebetween, and good electrical connection cannot be established due to a break in the aluminum layer or insulation by the formation of the aluminum layer. As discussed above, according to this exemplary embodiment, good electrical connection can be established between the second relay layer 402 and the pixel electrode 9a, thereby making it possible to continuously apply a voltage to the pixel electrode 9a or to maintain the potential retaining characteristic of the pixel electrode 9a.

The shielding layer 400 and the second relay layer 402 contain aluminum, which exhibits a relatively high light-reflection characteristic, and also contain titanium nitride, which exhibits a relatively high light-absorbing characteristic, thereby serving as a light-shielding layer. That is, by the shielding layer 400 and the second relay layer 402, it is possible to shield the semiconductor layer 1a of the TFT 30 from light incident from above (see FIG. 4). The same applies to the above-described capacitor electrodes 300 and data lines 6a, as described above. In this exemplary embodiment, the shielding layer 400, the second relay layer 402, the capacitor electrodes 300, and the data lines 6a form part of the laminated structure constructed on the TFT array substrate 10, and also serve as the upper light-shielding film to shield the TFT 30 from light incident from above (or serve as a "built-in light-shielding film" since the above-described elements form "part of the laminated structure"). According to the concept of the "upper light-shielding film" or "built-in light-shielding film", not only the above-described elements, but also the scanning lines 3a and the first relay layer 71 can be contained in the "upper light-shielding film" or "built-in light-shielding film". In short, in the broadest sense, any non-transparent material constructed on the TFT array substrate 10 can be referred to as the "upper light-shielding film" or "built-in light-shielding film".

On the above-described data lines 6a and under the shielding layer 400, a silicate glass film, such as NSG, PSG, BSG, or BPSG, a silicon nitride film, a silicon oxide film, or the second interlayer insulating film 42 preferably made of NSG is formed. In the second interlayer insulating film 42, the contact hole 87 to electrically connect the shielding layer 400 with the capacitor electrode 300 and the contact hole 85 to electrically connect the second relay layer 402 with the first relay layer 71 are formed. In the first exemplary embodiment, because of the formation of the second relay layer 402, electrical connection between the pixel electrode 9a and the TFT 30 are established via the three contact holes 83, 85, and 89, i.e., via the three interlayer insulating films 41, 42, and 43. As stated above, relatively small contact holes, which are easy to fabricate, are used to establish electrical connection between the pixel electrode 9a and the TFT 30. Thus, an electro-optical device can be manufactured with lower cost and higher reliability than when relatively large contact holes are used.

It is not essential that firing performed on the first interlayer insulating film 41 be performed on the second interlayer insulating film 42, in which case, stress occurring at the interfaces of the capacitor electrodes 300 can be reduced.

Lastly, in the fifth layer, the pixel electrodes 9a are formed in a matrix, and the alignment film 16 is formed on the pixel electrodes 9a, as stated above. The corners of the pixel electrodes 9a may be cut. Under the pixel electrodes 9a, a silicate glass film, such as NSG, PSG, BSG, or BPSG, a silicon nitride film, a silicon oxide film, or the third interlayer insulating film 43 preferably made of BPSG is formed. In this third interlayer insulating film 43, the contact hole 89 to electrically connect the pixel electrodes 9a with the second relay layer 402 is formed. Specifically in this exemplary embodiment, the surface of the third interlayer insulating film 43 is flattened by, for example, CMP (Chemical Mechanical Polishing), thereby reducing the disturbance of the alignment of the liquid crystal layer 50 caused by the difference of levels due to the presence of various wiring patterns and elements under the third insulating film 43. Not only is the third inter-layer insulating film 43 flattened, but flattening may also be performed by forming grooves in at least one of the TFT array substrate 10, the underlying insulating film 12, the first interlayer insulating film 41, and the second interlayer insulating film 42 so as to embed the wiring patterns, such as the data lines 6a, and the TFTs 30, therein. Alternatively, instead of flattening the third interlayer insulating film 43, the above-described grooves may simply be formed.

Light-Shielding Structure for TFT

The light-shielding structure, and more specifically, the structure of the scanning lines 3a including the gate electrodes of the TFTs 30, the grooves 12cv of the underlying insulating film 12, or the lower light-shielding film 11a, is described below.

A first aspect where light shielding when the grooves 12cv formed in the underlying insulating film 12 and the horizontal projections 3b extending from the scanning lines 3a are provided is discussed below.

Figure 5:
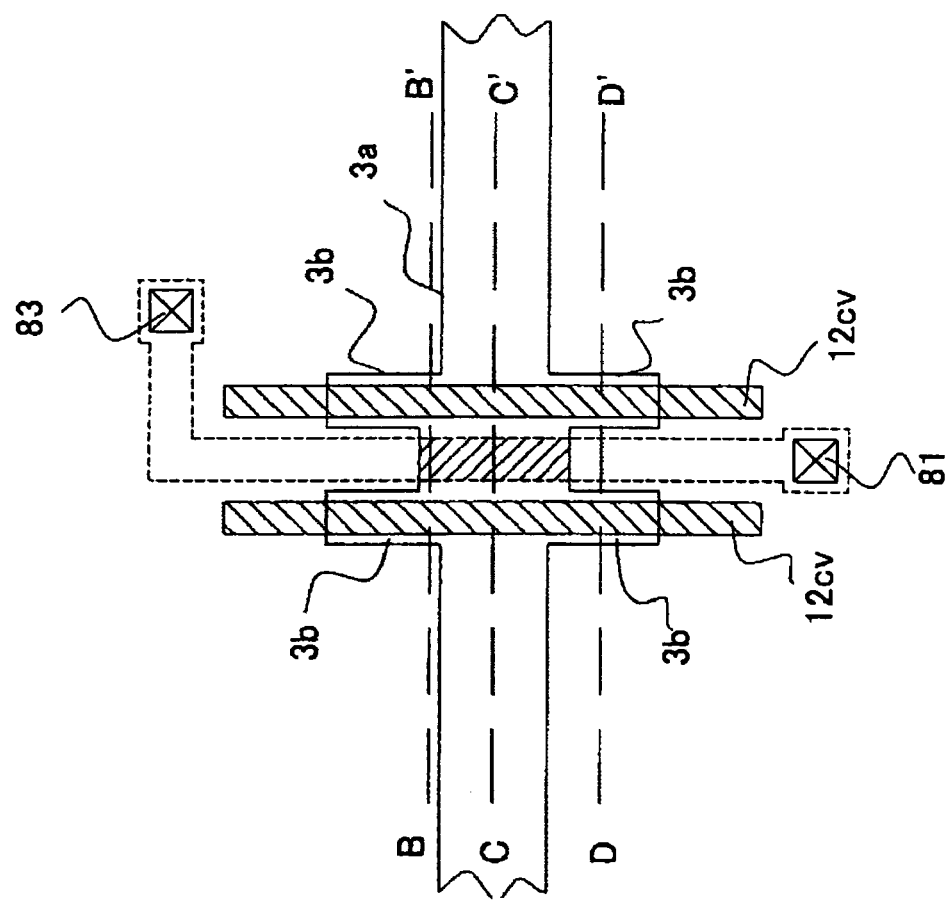
FIG. 5 is a plan view illustrating horizontal projections of the scanning lines 3a and grooves formed in an underlying insulating film extracted together with a semiconductor layer from the electro-optical device shown in FIG. 2.
Figure 6:
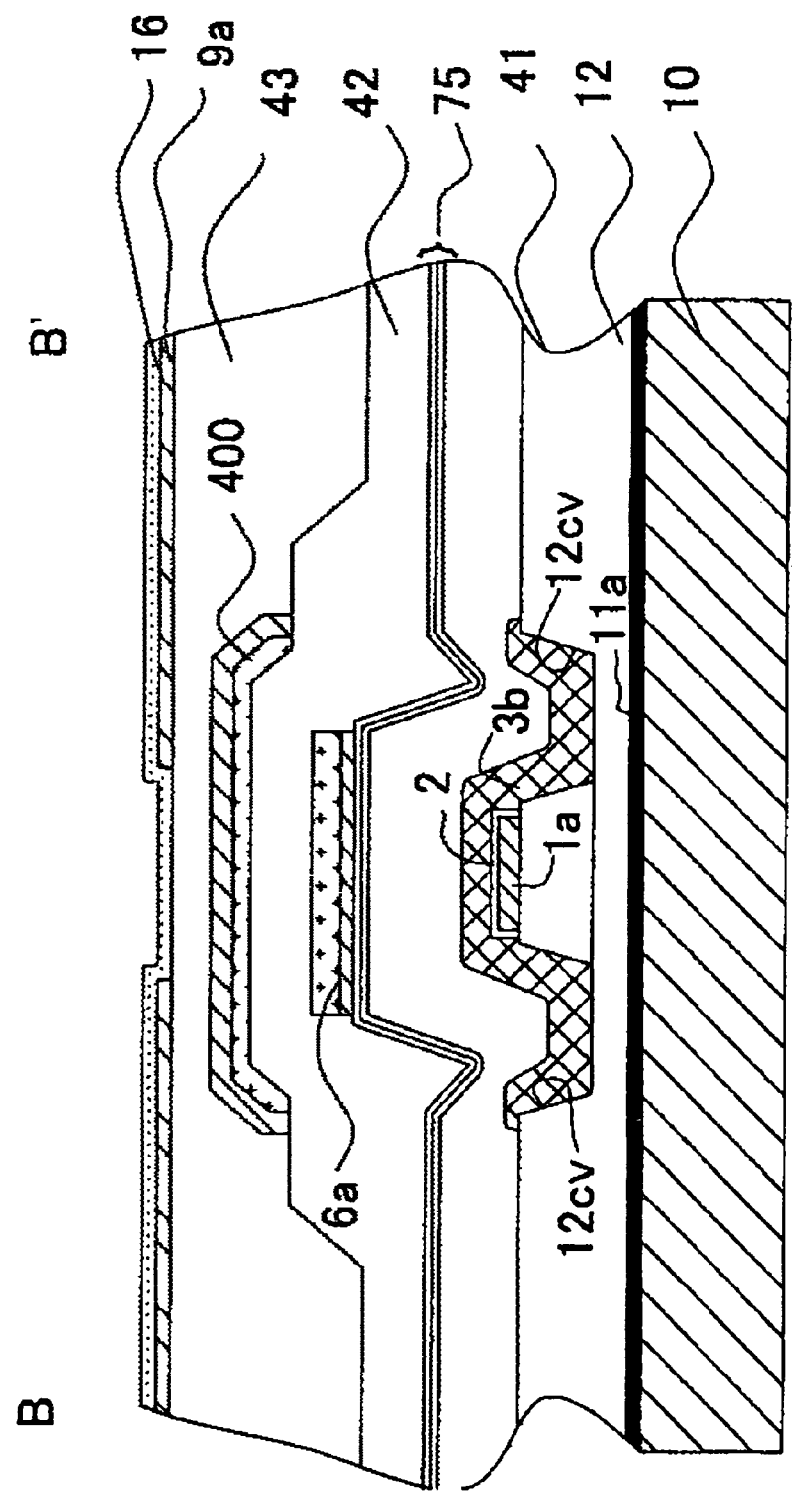
FIG. 6 is a sectional view taken along plane B–B' of FIG. 5.
Figure 7:
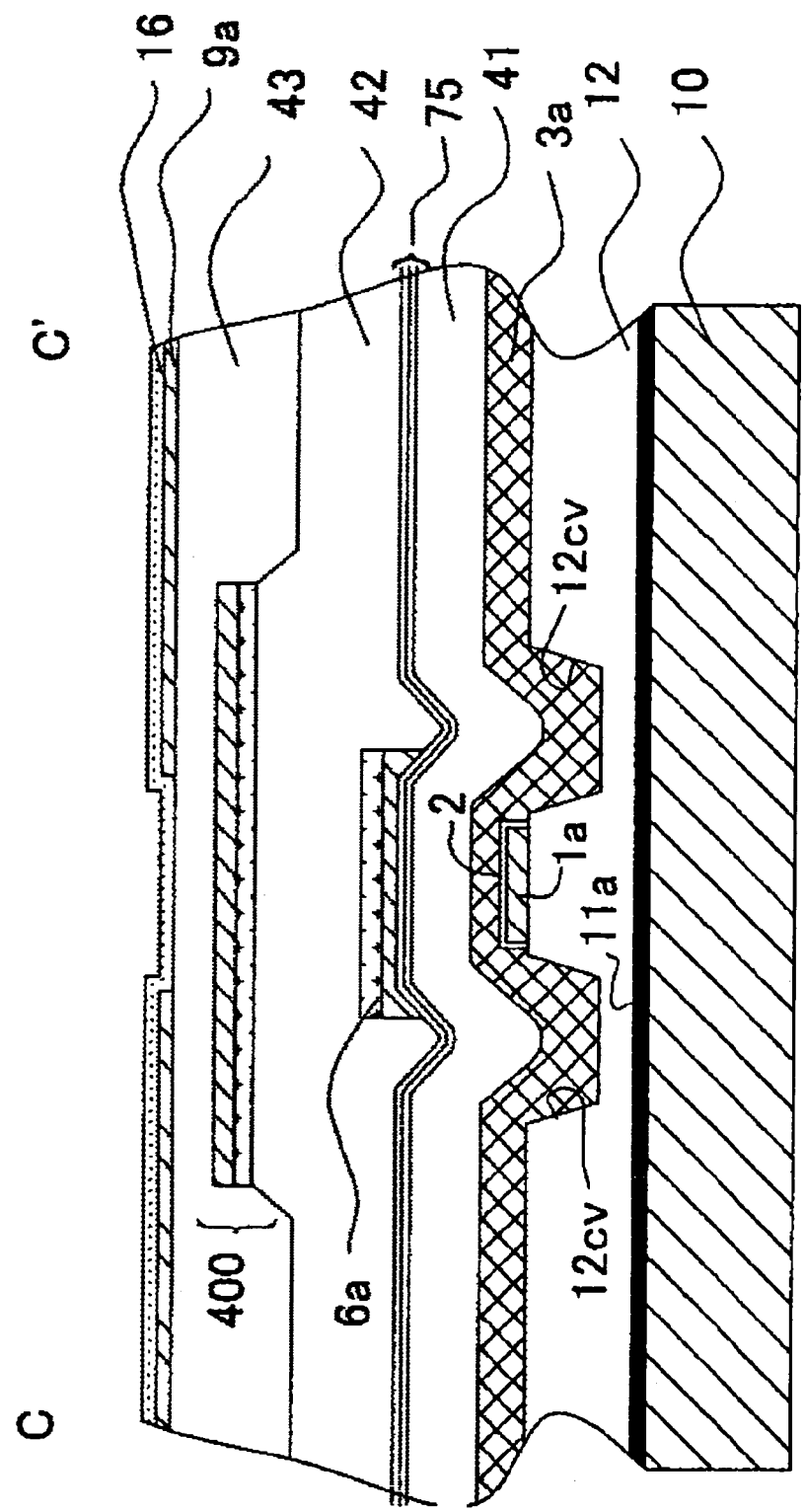
FIG. 7 is a sectional view taken along plane C–C' of FIG. 5.
Figure 8:
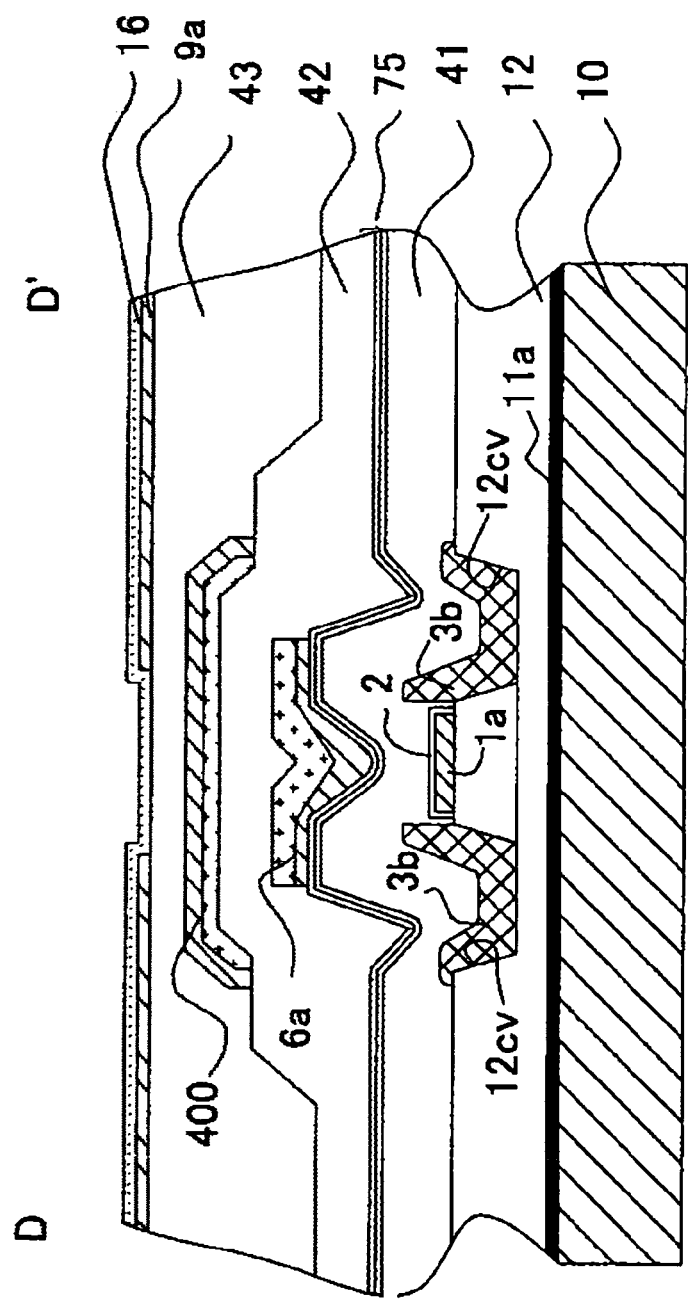
FIG. 8 is a sectional view taken along plane D–D' of FIG. 5.

First, the configuration and advantages of the scanning lines 3a and the horizontal projections 3b and the configuration and advantages of the grooves 12cv formed in the underlying insulating film 12 are described in detail below with reference to FIGS. 5 through 8. FIG. 5 is a plan view illustrating the horizontal projections 3b of the scanning lines 3a and the grooves 12cv formed in the underlying insulating film 12 extracted from FIG. 2 together with the semiconductor layer 1a. FIG. 6 is a sectional view taken along plane B–B' of FIG. 5. FIG. 7 is a sectional view taken along plane C–C' of FIG. 5. FIG. 8 is a sectional view taken along plane D–D' of FIG. 5.

As shown in FIGS. 5 through 8, the grooves 12cv are formed in the underlying insulating film 12 along the data lines 6a at both sides of the semiconductor layer 1a. The horizontal projections 3b of the scanning lines 3a are partially embedded in the grooves 12cv, and the first relay layer 71 and the capacitor electrodes 300 are partially recessed along the grooves 12cv with the first interlayer insulating film 41 therebetween. Accordingly, in the sectional views of FIGS. 6 through 8, the horizontal projections 3b of the scanning lines 3a and the capacitor electrodes 300 have recessed portions at the bottom along the grooves 12cv. In this aspect, since the horizontal projections 3b are embedded in the grooves 12cv, they also serve as vertical projections along the depth direction of the grooves 12cv.

According to this aspect, since the horizontal projections 3b are provided with the scanning lines 3a made of polysilicon, incident light obliquely applied to the surface of the TFT array substrate 10, light returned from the surface of the TFT array substrate 10, and oblique light, such as internal reflection light or multiple reflection light, resulting from the incident light and the returned light, can be absorbed or partially reflected not only by the main portions, which serve as the gate electrodes of the scanning lines 3a, but also particularly by the horizontal projections 3b. As a result, such light can be at least partially prevented from being incident on the channel region 1a' and adjacent regions, i.e., the low-density source region 1b and the low-density drain region 1c. In this case, light can be blocked by the horizontal projections 3b and the main portions of the scanning lines 3a, which are adjacent to the semiconductor layer 1a, and thus, light shielding can be performed very effectively.

Second, the scanning lines 3a (including the horizontal projections 3b), the first relay layer 71, and the capacitor electrodes 300, which serve as the upper light-shielding film to cover the semiconductor layer 1a from above, include recessed portions at the bottom in accordance with the grooves 12cv. With this configuration, compared to when the upper light-shielding film is flat, incident light obliquely applied to the substrate surface, and oblique light, such as the internal reflection light and multiple reflection light resulting from the above incident light or returning light can be prevented more effectively from being incident obliquely from above on the channel region 1a' and the adjacent regions. That is, the diffusion of light to be incident obliquely from above can be enhanced in accordance with the grooves 12cv by the top surface of the upper light-shielding film having a recessed portion at the bottom and a projecting portion at the top, thereby making it possible to reduce the quantity of light to be incident obliquely from above on the channel region 1a' and the adjacent regions. For the same reason, the lower light-shielding film 11a may be at least partially formed in the shape of a recess at the top and in the shape of a projection at the bottom, in a manner opposite to the upper light-shielding film.

In this exemplary embodiment, light shielding is performed on the TFTs 30 from above and below by the various light-shielding films shown in FIGS. 2 and 4. More specifically, the capacitor electrodes 300 and the shielding layer 400 serve as the upper light-shielding film for the incident light coming from above the electro-optical device, i.e., light coming from the incoming side of the incident light. The lower light-shielding film 11a literally serves as the lower light-shielding film for the returning light coming from below the electro-optical device, i.e., light coming from the outgoing side of the incident light.

Accordingly, it is apparently not necessary to provide the horizontal projections 3b for the scanning lines 3a or to form the grooves 12cv to change the shape of the capacitor electrodes 300, which serve as the upper light-shielding film. However, incident light contains light obliquely applied to the TFT array substrate 10. Thus, the oblique light is reflected at the top surface of the TFT-array substrate 10, the top surface of the lower light-shielding film 11a, or at the bottom surface of the upper light-shielding film, and such reflected light is further reflected at another surface in the electro-optical device, thereby generating internal reflection light or multiple reflection light. Accordingly, even if the upper and lower light-shielding films are provided above and below the TFTs 30, the oblique light is applied via the gap between the light-shielding films. Thus, the horizontal projections 3b, which block light from both sides of the semiconductor layer 1a, and the recessed portions corresponding to the grooves 12cv produce a high light-shielding effect.

As described above, according to the electro-optical device of this exemplary embodiment, by providing the horizontal projections 3b and the grooves 12cv, the light-resistance characteristic can be enhanced, and even under harsh conditions in which high-intensity incident light or returning light is applied, precise switching-control can be performed on the pixel electrodes 9a by the TFTs 30, which have a reduced light leakage current. As a result, bright, high-contrast images can be displayed.

Additionally, in this exemplary embodiment, the upper light-shielding film is formed of part of the scanning lines 3a including the horizontal projections 3b, the capacitor electrodes 300, and the shielding layer 400, thereby enhancing the simplicity of the overall laminated structure on the TFT array substrate 10 and the overall manufacturing process. In this exemplary embodiment, since the horizontal projections 3b are integrally formed together with the scanning lines 3a as the same film, an additional step for forming the horizontal projections 3b is not necessary.

In this aspect, the grooves 12cv do not reach the lower light-shielding film 11a, and thus, the scanning lines 3a including the horizontal projections 3b formed to cover the bottom surfaces of the grooves 12cv and the vertical projections formed along the depth direction are not in contact with the lower light-shielding film 11a. Therefore, although the lower light-shielding film 11a is a conductive film, the adverse influence of potential variations of the lower light-shielding film 11a on the scanning lines 3a can be reduced or prevented.

According to the above-described aspect, as in the lower light-shielding film 11a, the scanning lines 3a may be formed of a light-shielding film containing a metal or an alloy (a metal, an alloy, metal siliside, or polysiliside containing at least one of high melting-point metals consisting of Ti, Cr, W, Ta, and Mo, or a laminated layer of these elements). With this configuration, the reflection characteristic of toe scanning lines 3a and the horizontal projections 3b can be increased so as to further enhance the light-shielding characteristic for the oblique light incident on the channel region 1a' and the channel adjacent regions.

Although four horizontal projections 3b are formed for each channel region 1a', one horizontal projection 3b may be formed only at one side of the channel region 1a', or it may be formed only on the upper side or the lower side of the channel region 1a' in FIG. 2. In this case, some of the advantages obtained when the four horizontal projections 3b are formed can be achieved. For example, if it is difficult to form a total of four horizontal projections 3b at both sides and at the upper and lower sides of the channel region 1a' because of the arrangement of wiring patterns and elements around the semiconductor layer 1a, one to three horizontal projections 3b may be provided at only one side, or at only the upper or lower side of the channel region 1a' without changing the layout.

Figure 9:
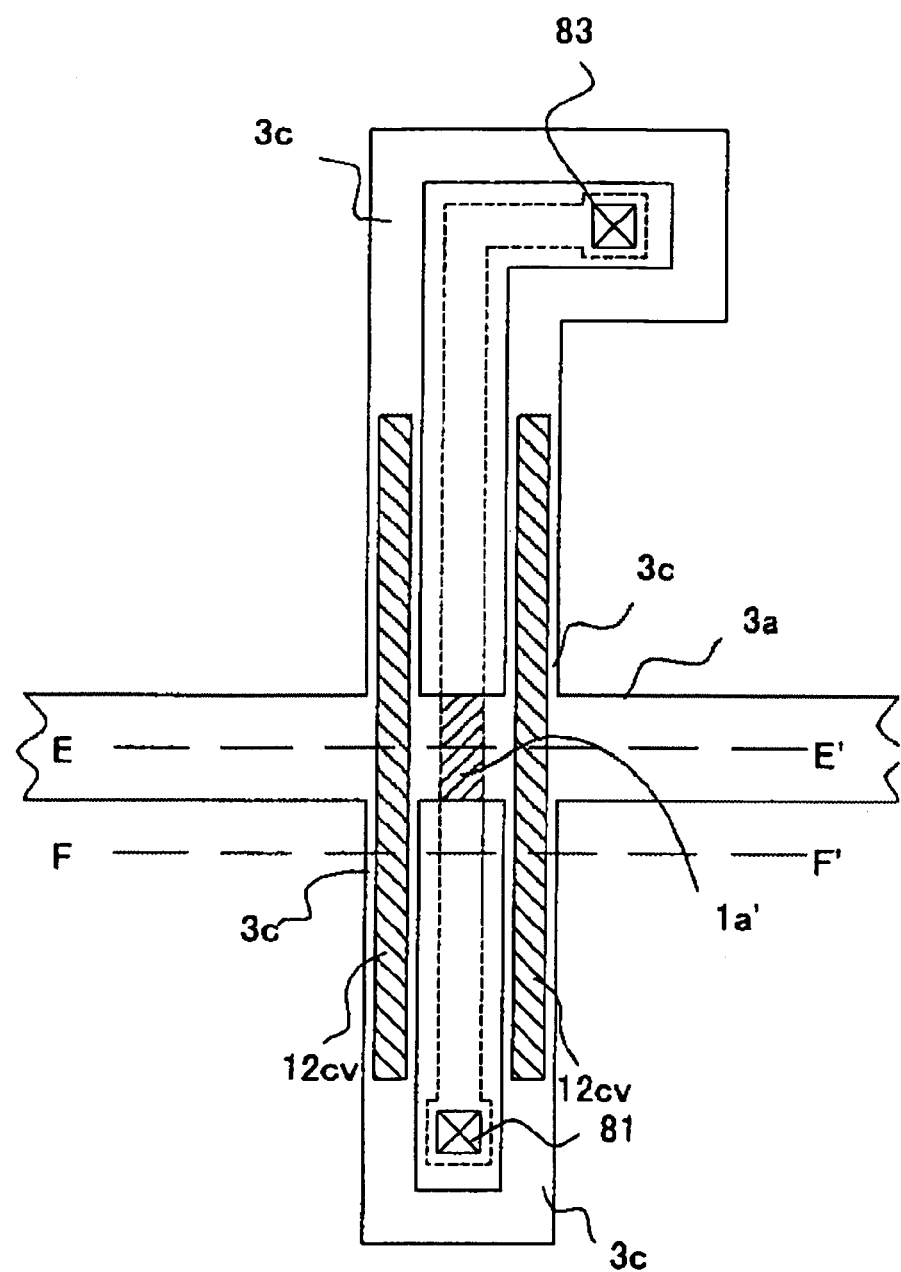
FIG. 9 is a plan view similar to that of FIG. 5, in which the horizontal projections shown in FIG. 5 are substituted by surrounding portions.
Figure 10:
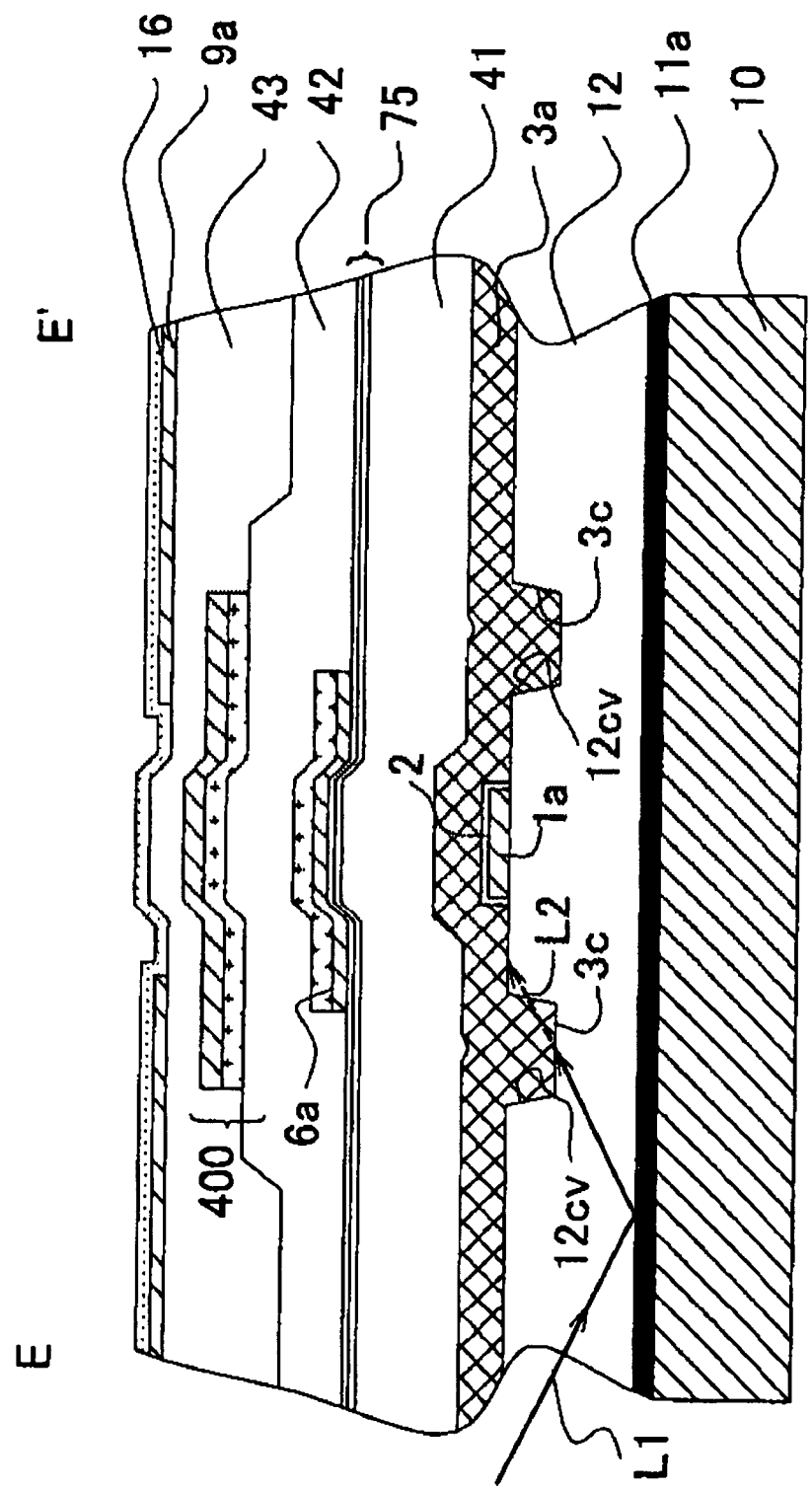
FIG. 10 is a sectional view taken along plane E–E' of FIG. 9.
Figure 11:
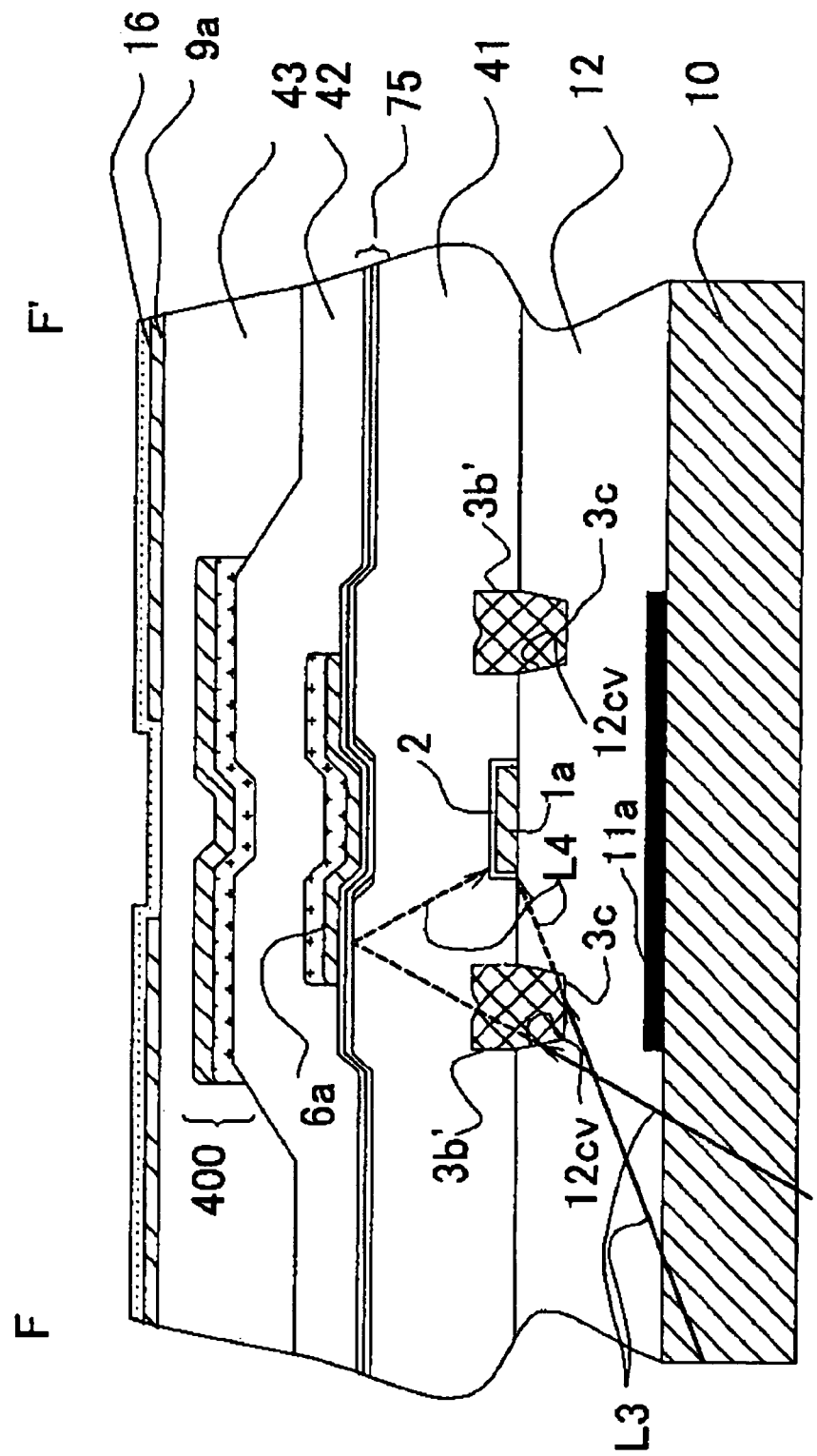
FIG. 11 is a sectional view taken along plane F–F' of FIG. 9.
Figure 12:
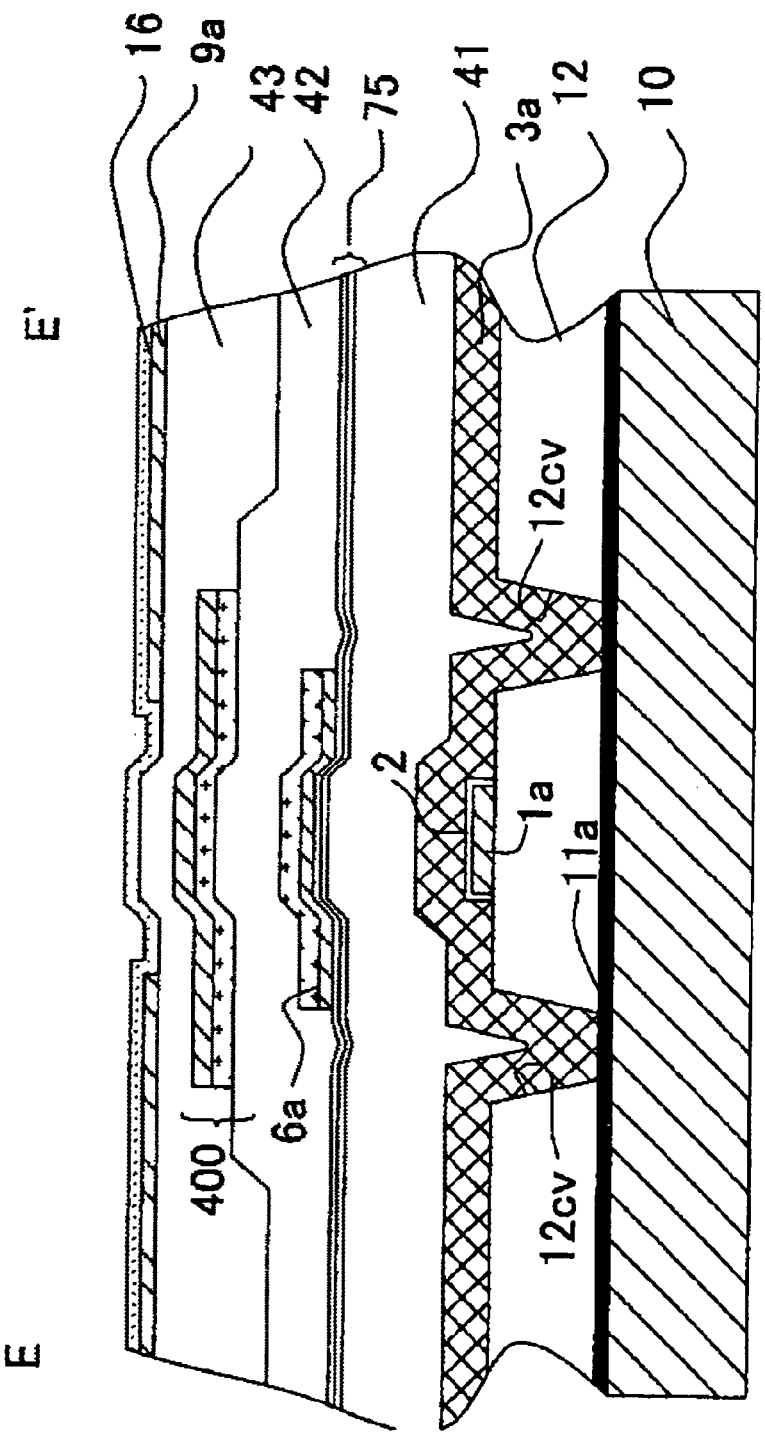
FIG. 12 is a sectional view taken along plane E–E' of a modified example made to FIG. 9.

A second aspect where light-shielding when the horizontal projections 3b are substituted by surrounding portions 3c is discussed below An aspect in which surrounding portions 3c surrounding the semiconductor layer 1a are formed for surrounding the scanning lines 3a is described below with reference to FIGS. 9 through 11. FIG. 9 is a plan view similar to that of FIG. 5, in which the horizontal projections 3b are substituted by the surrounding portions 3c. FIG. 10 is a sectional view taken along plane E–E' of FIG. 9. FIG. 11 is a sectional view taken along plane F–F' of FIG. 9. FIG. 12 is sectional view taken along plane E–E' of a modified example made to the configuration shown in FIG. 9.

According to this aspect, as shown in FIGS. 9 through 11, instead of the above-described horizontal projections 3b, the surrounding portion 3c is formed from the main line portion of the scanning line 3a at a position away from the channel region 1a' by a predetermined distance along the scanning line 3a when viewed from the top, such that it surrounds the entire semiconductor layer 1a including the channel region 1a' and areas in which contact holes are formed, that is, the areas in which the contact holes 83 and 81 are formed. The other points concerning the configuration are similar to those of the above-described first aspect; for example, the surrounding portion 3c also serves as vertical projections along the depth direction of the groove 12cv since it is embedded in the groove 12cv.

Also in this aspect, since the semiconductor layer 1a is held between the lower light-shielding film 11a and the upper light-shielding film with a relatively small interlayer distance therebetween, a very high light-shielding characteristic for the light perpendicular to the substrate surface can be obtained. In particular, as shown in FIGS. 10 and 11, the incident light and returning light obliquely applied to the substrate surface, and oblique light L1 and L3, such as the internal reflection light and multiple reflection light resulting from the incident light or returning light, can be partially attenuated to low-intensity light L2 and L4, respectively, by light absorption or light reflection implemented by, not only the main line portion of the scanning lines 3a, but also the surrounding portion 3c, before reaching the semiconductor layer 1a. In this case, light is blocked by the surrounding portion 3c disposed at a position very close to the semiconductor layer 1a, and thus, light L1 and L3 tilted in any direction can be blocked by the surrounding portion 3c very effectively.

Specifically in this aspect, the semiconductor layer 1a including the areas in which the contact holes 81 and 83 are formed is surrounded, thereby enhancing the light-shielding characteristic around the contact holes 81 and 83 vulnerable to leakage of light.

In this aspect, instead of the configuration shown in FIG. 10, vertical projections may be in contact with the lower-light-shielding film 11a, as shown in FIG. 12. In this modification, the semiconductor layer 1a is disposed in a closed space, and light shielding can be performed for the semiconductor layer 1a more effectively. In the aspect shown in FIGS. 5 through 8, the scanning lines 3a may be in contact with the lower light-shielding film 11a.

In this modification, however, the scanning lines 3a may be adversely influenced by potential variations of the lower light-shielding layer 11a, as stated above. Accordingly, by comparing a required level of light shielding for the semiconductor layer 1a with the adverse influence of potential variations of the lower light-shielding film 11a, a determination should be made as to whether the scanning lines 3a are to be in contact with the lower light-shielding film 11a.

In this aspect, the groove 12cv maybe formed along the entire surrounding portion 3c of the scanning line 3a so as to form portions projecting downward along the entire surrounding portion 3c, namely, vertical projections may be formed. By providing the surrounding portion 3c, as in this aspect, if the width of the area in which the contact holes of the semiconductor area 1a are formed is set to be the same as the width of the channel region 1a', the surrounding portion 3c generally formed in a rectangle when viewed from the top can surround the semiconductor layer 1a at a position relatively close to the semiconductor layer 1a. Thus, a higher light-shielding characteristic can be obtained.

Additionally, since the surrounding portion 3c is embedded in the groove 12cv, it also serves as a vertical projection, as stated above. In this aspect, however, a horizontal surrounding portion to merely surround the semiconductor layer 1a may be provided, in which case, some of the advantages described above can be achieved. The present invention encompasses such a aspect.

A third aspect where light-shielding when grooves 12cva extending along scanning lines 3a are provided is discussed below.

Figure 13:
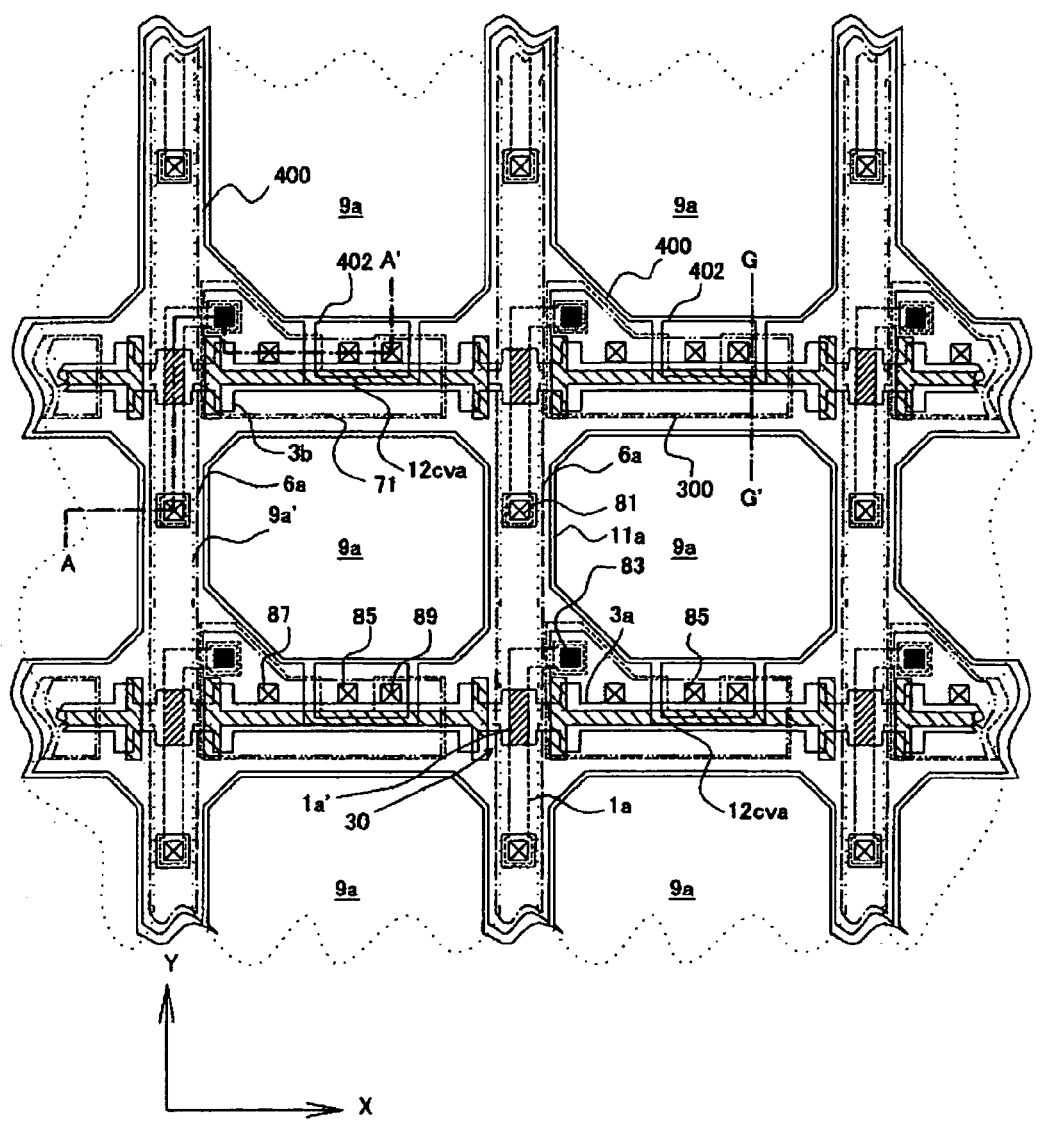
FIG. 13 is a plan view similar to that of FIG. 2, except that grooves formed along the scanning lines are formed in the underlying insulating layer.
Figure 14:
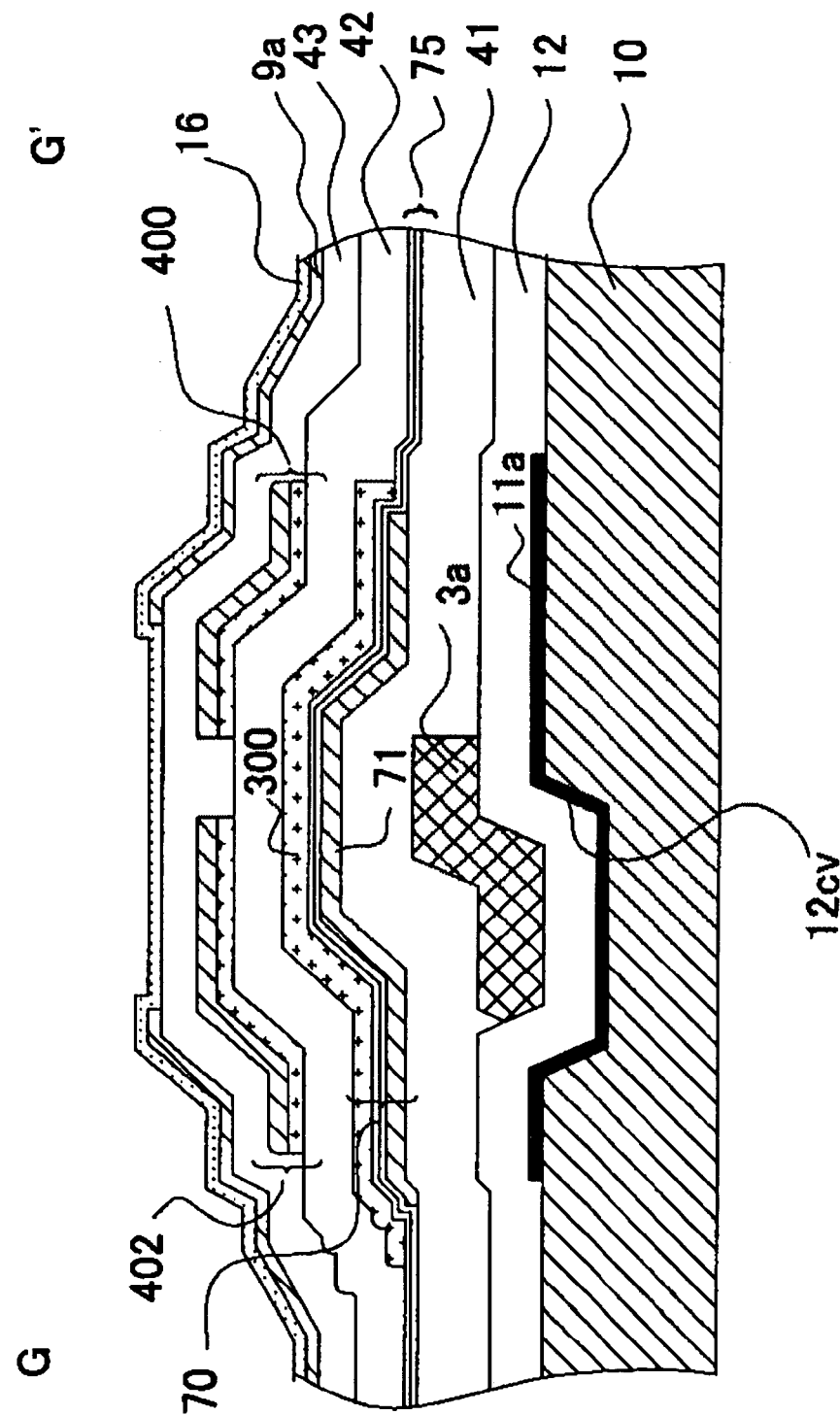
FIG. 14 is a sectional view taken along plane G–G' of FIG. 13.

Third, an aspect in which grooves 12cva extending along the scanning lines 3a are formed, and the main line portions of the scanning lines 3a are partially embedded in the grooves 12cva is described below with reference to FIGS. 13 through 16. FIG. 13 is a plan view similar to that of FIG. 2, except that the grooves 12cva extending along the scanning lines 3a are formed in the underlying insulating layer 12. FIG. 14 is a sectional view taken along plane G–G' of FIG. 13, and FIGS. 15 and 16 are sectional views taken along plane G–G' of FIG. 13 and illustrate modified examples made to the configuration shown in FIG. 14.

The scanning line 3a is disposed in the groove 12cva extending along the scanning line 3a and also has an in-groove portion which partially covers the channel region 1a' and the adjacent regions from the sides. Accordingly, also in this aspect, because of the light absorption or light reflection of this in-groove portion, the channel region 1a' and the adjacent regions can be partially shielded from incident light obliquely applied to the substrate surface, in particular, returning light obliquely applied to the rear surface, or oblique light, such as internal reflection light and multiple reflection light resulting from the incident light or returning light. By enhancing light-resistance characteristic as described above, even under harsh conditions in which high-intensity incident light or returning light is applied, precise switching-control can be performed on the pixel electrodes 9a by the TFTs 30, which have a reduced light leakage current.

Figure 15:
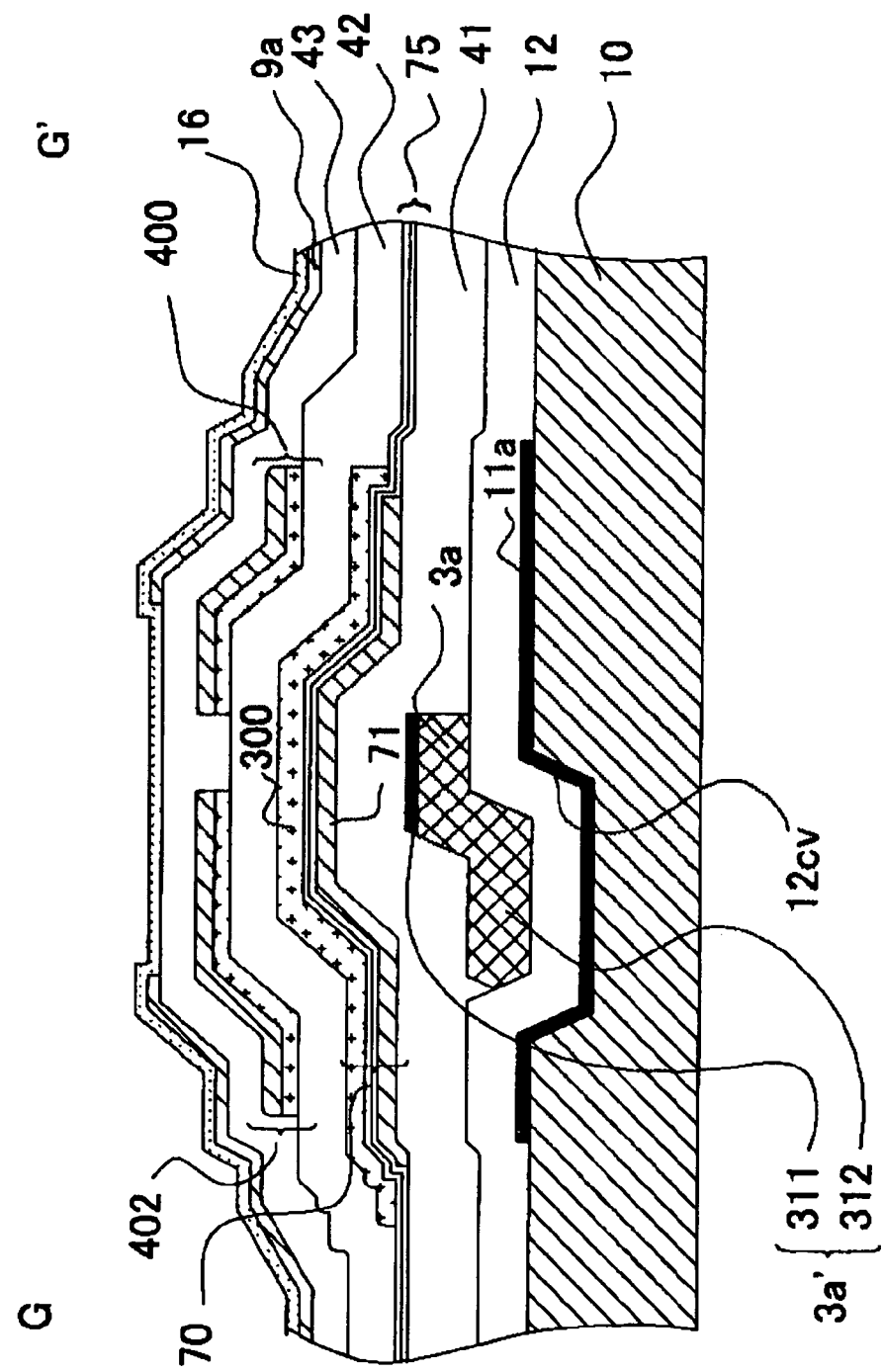
FIG. 15 is a sectional view taken along plane G–G' of FIG. 13 of a modified example made to FIG. 14.

In this aspect, instead of the scanning line 3a having a single layered structure shown in FIG. 14, a scanning line 3a' formed of a laminated block including a first layer 311 made of a light-shielding material and a second layer 312 made of a light-absorbing material may be formed, as shown in FIG. 15. In this case, the first layer 311 is composed of, for example, WSi or TiSi. The second layer 312 is composed of, for example, SiGe, or a polysilicon film having the same layer as the semiconductor layer 1a. By providing the scanning line 3a' the light-shielding characteristic for the channel region 1a' and the adjacent regions can also be enhanced according to the in-groove portion of the scanning line 3a' disposed in the groove 12cva, and also, the wiring resistance of the scanning line 3a' can be reduced. The second layer 312 made of, for example, SiGe, can effectively serve as the gate electrode positioned opposite to the gate oxide film of the TFT 30. The lamination order of the first layer 311 and the second layer 312 may be reversed.

Figure 16:
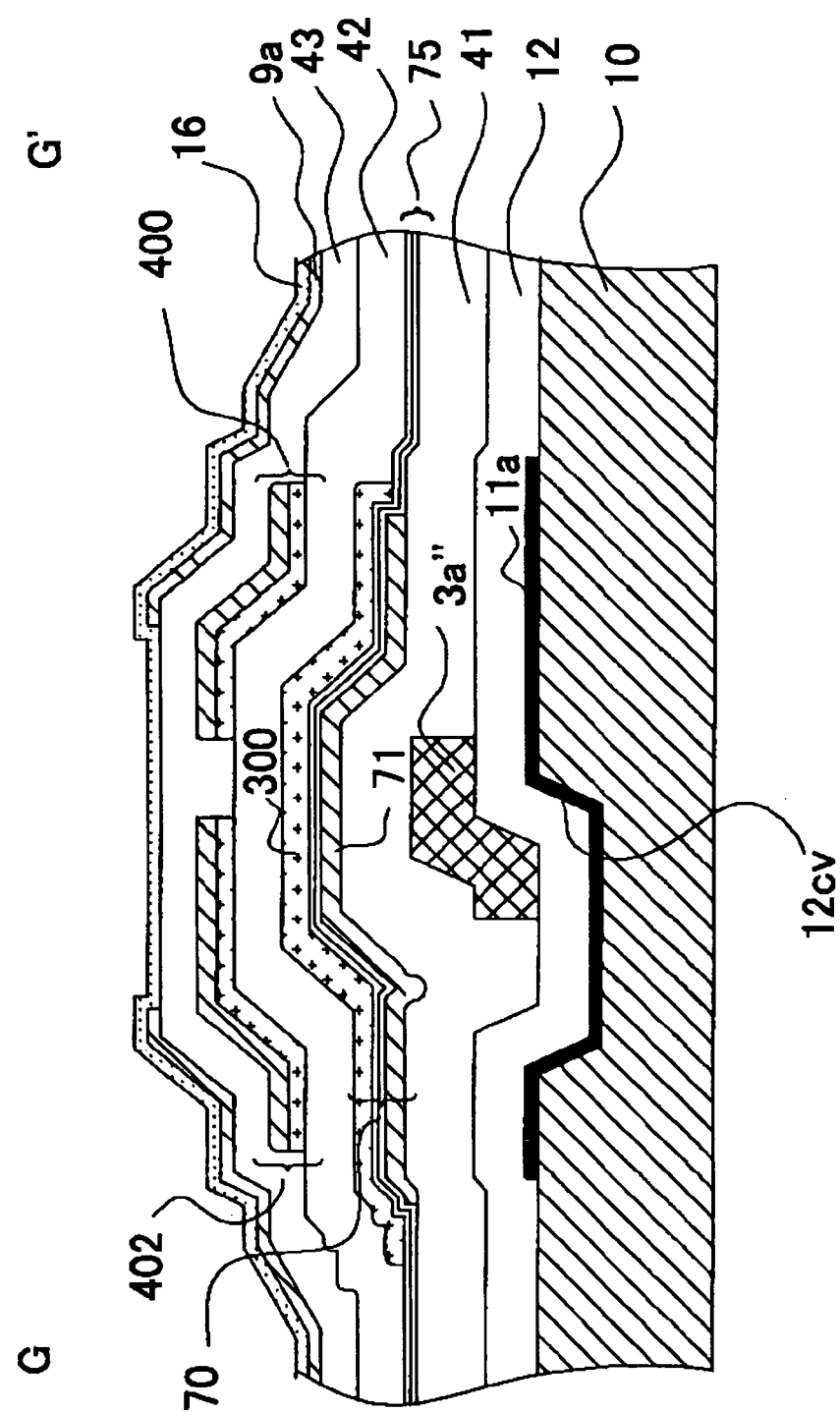
FIG. 16 is a sectional view taken along plane G–G' of FIG. 13 of a modified example made to FIG. 14.

Alternatively, as shown in FIG. 16, a scanning line 3a" may be formed such that it is not entirely embedded in the groove 12cva. By providing the scanning line 3a", the light-shielding characteristic for the channel region 1a' and the adjacent regions can be enhanced according to the in-groove portion disposed in the groove 12cva, and also, the wiring resistance of the scanning line 3a" can be reduced.

According to the light-shielding structure and advantages, light coming from above and below the TFTs 30, light coming from the sides of the TFTs 30, and light obliquely incident on the TFTs 30 can be effectively blocked, thereby making it possible to reduce or prevent the generation of a light leakage current in the TFTs 30. The above-described upper light-shielding film or built-in light-shielding film also greatly contributes to such advantages.

That is, in the laminated structure including the scanning lines 3a, the data lines 6a, the capacitor electrodes 300, the shielding layer 400, etc., various elements made of a non-transparent material formed above the TFTs 30 can shield the semiconductor layer 1a of the TFTs 30 from light coming from above the TFTs 30, thereby suppressing the generation of a light leakage current in the semiconductor layer 1a.

According to this exemplary embodiment, therefore, the switching operation of the TFTs 30 can be precisely performed, and also, it is possible to avoid constant biasing to the semiconductor layer 1a caused by a light leakage current, thereby implementing high-frequency driving. If light-shielding is effectively performed on the TFTs 30, the size of the electro-optical device can be reduced without any problem. That is, even if the size of the electro-optical device is reduced, a certain level of pixel aperture ratio is required to display images having a certain level of brightness. Accordingly, if the size of the electro-optical device is reduced, the possibility of light being incident on the TFTs 30 is increased.

As described above, according to the electro-optical device of this-exemplary embodiment, high-quality images can be displayed by high-frequency driving while maintaining the voltage applied to the pixel electrodes substantially at a certain level and also implementing a smaller and higher-definition electro-optical device.

A second exemplary embodiment where when a shielding layer and data lines are formed in different layers is described below.

Figure 17:
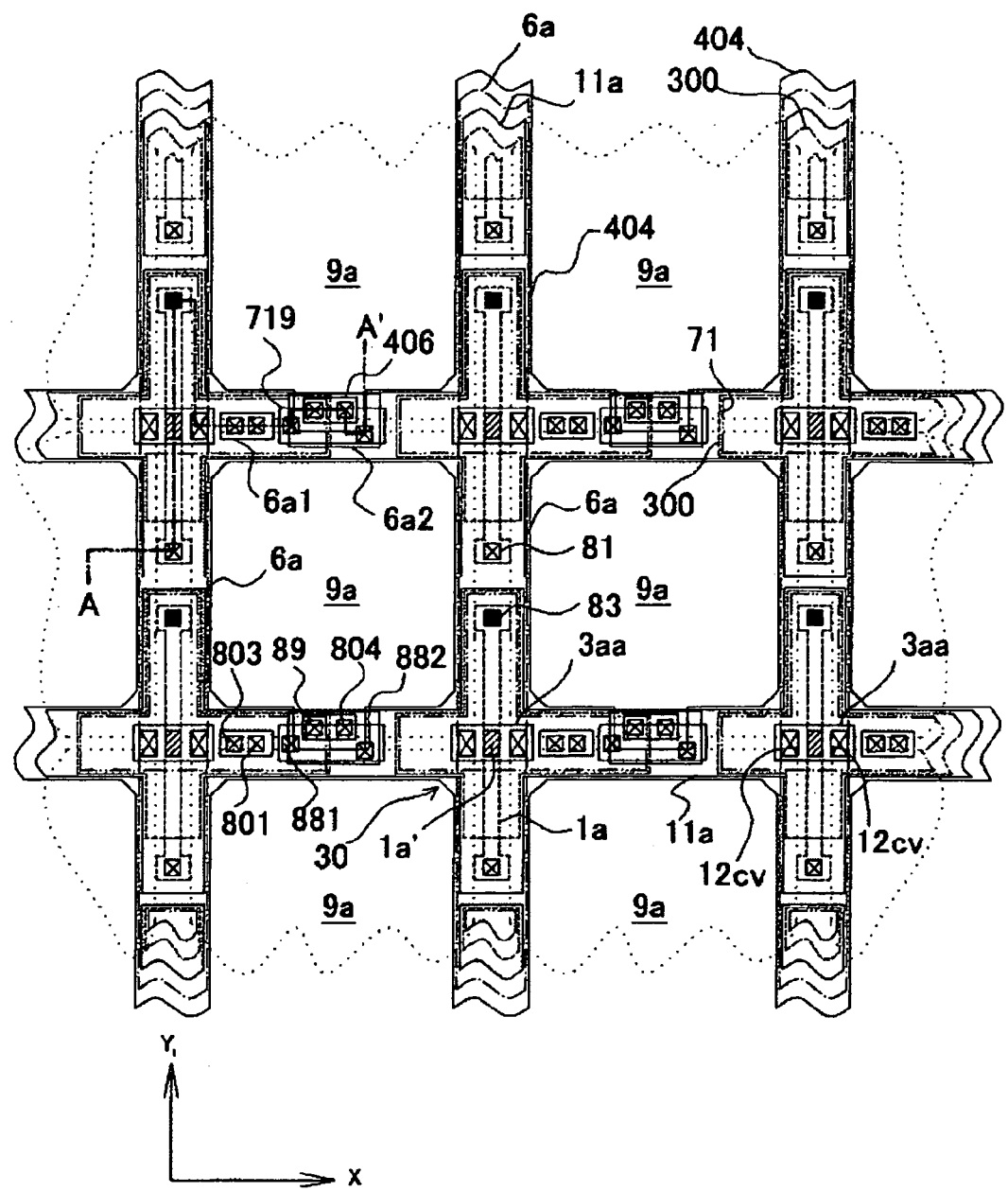
FIG. 17 is a plan view illustrating a plurality of pixel groups adjacent to each other having data lines, scanning lines, and pixel electrodes thereon formed of the TFT array substrate in an electro-optical device of a second exemplary embodiment of the present invention.
Figure 18:
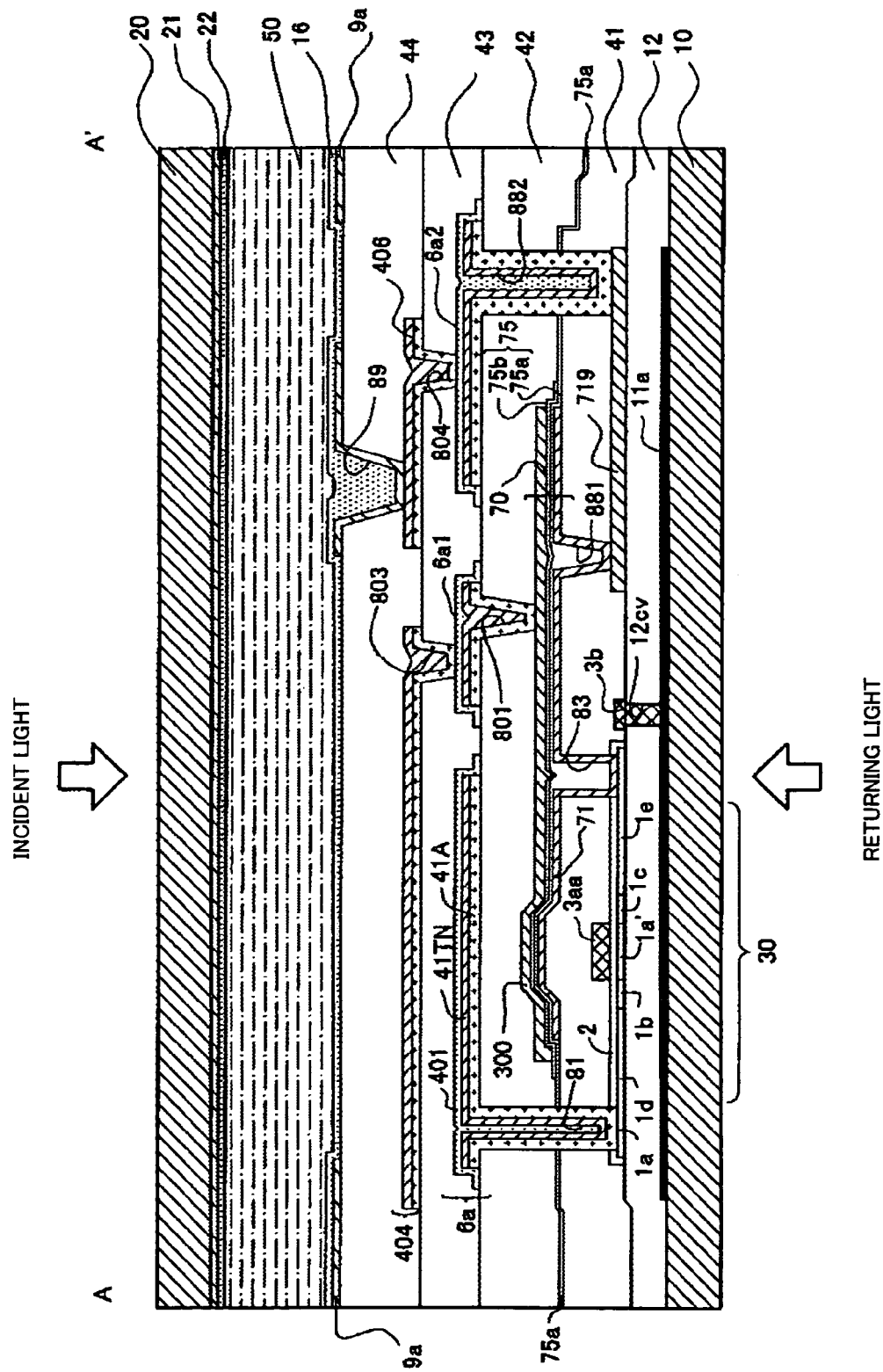
FIG. 18 is a sectional view taken along plane A–A' of FIG. 17.

An electro-optical device according to a second exemplary embodiment of the present invention is described below with reference to FIGS. 17 through 19. FIG. 17 is a plan view similar to that of FIG. 2 and illustrates a plurality of pixel groups adjacent to each other having data lines, scanning lines, pixel electrodes, etc. thereon on a TFT array substrate. FIG. 18, which is similar to FIG. 4, is a sectional view taken along plane A–A' of FIG. 17. FIG. 19 is a plan view illustrating the arrangement of a nitride film, which is a characteristic feature of the second exemplary embodiment. The configuration of the electro-optical device of the second exemplary embodiment is similar to that of the pixel portions of the electro-optical device according to the first exemplary embodiment.

Accordingly, only the portions unique to the second exemplary embodiment are described below, and an explanation of the other features is omitted or simplified.

The second exemplary embodiment, shown in FIG. 18, differs from the first exemplary embodiment, shown in FIG. 4, in the following points. The capacitor electrodes 300, which serve as the upper electrodes, forming the storage capacitors 70 are not formed together with the data lines 6a as the same film. Accordingly, an additional interlayer insulating film is provided, that is, a "fourth interlayer insulating film 44" is provided. Relay electrodes 719 are formed together with gate electrodes 3aa as the same film. Thus, the laminated structure is formed of, starting from the TFT array substrate 10, a first layer including the lower light-shielding film 11a, which also serves as the scanning lines, a second layer including the TFTs 30 having the gate electrodes 3aa, a third layer including the storage capacitors 70, a fourth layer including the data lines 6a, a fifth layer on which a shielding layer 404 is formed, and a sixth layer (uppermost layer) including the above-described pixel electrodes 9a and alignment film 16. The underlayer insulating film 12 is disposed between the first layer and the second layer, the first interlayer insulating film 41 is disposed between the second layer and the third layer, the second interlayer insulating film 42 is disposed between the third layer and the fourth layer, the third interlayer insulating film 43 is disposed between the fourth layer and the fifth layer, and the fourth interlayer insulating film 44 is disposed between the fifth layer and the sixth layer. With this arrangement, short-circuiting between the layers can be reduced or prevented.

In the first exemplary embodiment, the scanning lines 3a are formed on the second layer. In the second exemplary embodiment, however, the gate electrodes 3aa are formed instead of the scanning lines 3a, and also, the relay electrodes 719 are formed together with the gate electrodes 3aa as the same film. Details of the configurations of the individual layers are given below.

In the second layer, the gate electrodes 3aa are formed to oppose the channel regions 1a' of the semiconductor layer 1a. The gate electrodes 3aa are not linearly formed, unlike the scanning line 3a of the first exemplary embodiment, and are isolated from each other since the semiconductor layer 1a and the channel regions 1a' are isolated from each other on the TFT array substrate 10. Accordingly, in the second exemplary embodiment, the grooves 12cv forming contact holes have a depth such that the bottom surfaces thereof are in contact with the surface of the lower light-shielding film 11a of the first layer, and the lower light-shielding film 11a is formed in a striped shape while extending in the X direction in FIG. 17. Thus, the gate electrodes 3aa formed on the grooves 12cv are electrically connected to the lower light-shielding film 11a via the grooves 12cv. That is, in the second exemplary embodiment, scanning signals are supplied to the gate electrodes 3aa via the lower light-shielding film 11a. In other words, the lower light-shielding film 11a of the second exemplary embodiment serves as the scanning lines.

As shown in FIG. 17, the lower light-shielding film 11a in the second exemplary embodiment has projections along the data lines 6a. With this arrangement, the lower light-shielding film 11a of the second exemplary embodiment exhibits a light-shielding function similar to that of the lattice-like light-shielding film 11a of the first exemplary embodiment. It should be noted, however, that adjacent projections of the light-shielding film 11a are not in contact with each other, and are electrically insulated; otherwise, the lower light-shielding film 11a cannot function as the scanning lines. The lower light-shielding film 11a also has projecting portions to chamfer the corners of the pixel electrodes 9a at the intersections of the light-shielding film 11a and the data lines 6a.

Specifically in the second exemplary embodiment, the relay electrodes 719 are formed together with the gate electrodes 3aa as the same film. The relay electrodes 719 are isolated, as shown in FIG. 17, from each other such that they are positioned at substantially the center of one side of each of the pixel electrodes 9a when viewed from the top. Since the relay electrodes 719 are formed together with the gate electrodes 3aa as the same film, the relay electrodes 719 are made of a conductive polysilicon film if the gate electrodes 3aa are made of a conductive polysilicon film.

In the third layer, the first relay layer 71, the dielectric film 75, and the capacitor electrodes 300 forming the storage capacitors 70 are formed. Among these elements, the first relay layer 71 is formed of polysilicon. The capacitor electrodes 300 are not formed together with the data lines 6a as the same film. Thus, it is not essential that the capacitor electrodes 300 have a double layered structure including an aluminum film and a conductive polysilicon film in order to establish an electrical connection between the data lines 6a and the TFTs 30, as in the first exemplary embodiment. Accordingly, as in the lower light-shielding film 11a, the capacitor electrodes 300 may be formed of a light-shielding material, such as a metal, an alloy, metal siliside, or polysiliside containing at least one of high melting-point metals consisting of Ti, Cr, W, Ta, and Mo, or a laminated layer of these elements. With this configuration, the capacitor electrodes 300 exhibit a function as the above-described "upper light-shielding film" or "built-in light-shielding film" (concerning the materials forming the capacitor electrodes 300 of the second exemplary embodiment, see below).

For the same reason, i.e., since the capacitor electrodes 300 and the data lines 6a are formed as different layers, it is not necessary to establish electrical insulation between the two elements in the same plane. This makes it possible to form the capacitor electrodes 300 as part of the capacitor lines extending along the gate electrodes 3aa (scanning lines).

The data lines 6a formed in the fourth layer may be formed of aluminum or an aluminum alloy.

The first interlayer insulating film 41 is formed on the gate electrodes 3aa and the relay electrodes 719 and under the storage capacitors 70. As described above, the first interlayer insulating film 41 may be composed of a silicate glass film, such as NSG, PSG, BSG, or BPSG, a silicon nitride film, or a silicon oxide film. In the first interlayer insulating film 41, a contact hole 881 having an electrical connecting point at the bottom surface of the first relay layer 71 in FIG. 18 is formed. With this contact hole 881, electrical connection between the first relay layer 71 and the relay electrode 719 can be established. Also in the first interlayer insulating film 41, for establishing electrical connection between the relay electrode 719 and a second relay layer 6a2, which is described below, a contact hole 882 is formed such that it passes through the second interlayer insulating film 42, which is described below.

Specifically in the second exemplary embodiment, the data lines 6a made of, for example, aluminum, as stated above, are formed as a film having a triple layered structure including an aluminum layer (see reference numeral 41A), a titanium nitride layer (see reference numeral 41TN), and a silicon nitride layer (see reference numeral 401), from the bottom. The silicon nitride layer 401 is patterned to be slightly larger than the other layers so that it covers the aluminum layer and the titanium nitride layer disposed under the silicon nitride layer 401. Since the data lines 6a contain aluminum, which is a relatively low-resistance material, image signals can be continuously supplied to the TFTs 30 and the pixel electrodes 9a. Additionally, since the silicon nitride layer 401, which sufficiently prevents the entry of water, is formed as the top layer of the data lines 6a, the moisture resistance of the TFTs 30 can be enhanced, thereby prolonging the life of the TFTs 30. As the silicon nitride film, a plasma silicon nitride film is desirably used.

The silicon nitride layer 401 of this exemplary embodiment is formed as the top layer of the data lines 6a, and is also formed around the image display area 10a in which the pixel electrodes 9a are formed in a matrix, and the data lines 6a and the gate electrodes 3aa (scanning lines) are disposed in the gaps between the pixel electrodes 9a. The thickness of the titanium nitride layer 41TN and the silicon nitride layer 401 is, for example, about 10 to 100 nm, and more preferably, about 10 to 30 nm.

As described above, the silicon nitride layer 401 of this exemplary embodiment is formed, on the whole, as the configuration as schematically shown in FIG. 19 on the TFT array substrate 10. The silicon nitride layer 401 disposed around the image display area 10a shown in FIG. 19 greatly contributes to preventing the entry of water into CMOS (Complementary MOS) TFTs forming the data-line drive circuit 101 and scanning-line drive circuits 104, which are described below (see FIG. 20). However, nitrides exhibit a smaller etching rate of, for example, dry etching, than other general materials. Thus, if it is necessary to form contact holes in the silicon nitride layer 401 disposed around the image display area 10a, holes should be formed in advance at positions at which the contact holes are to be formed. This can be performed simultaneously with patterning the silicon nitride layer 401 shown in FIG. 19, thereby simplifying the manufacturing process.

In the fourth layer, as the same film as the data line 6a, a shielding-layer relay layer 6a1 and the second relay layer 6a2 (which is slightly different from the "second relay layer" in the first exemplary embodiment) are formed. The shielding layer relay layer 6a1 is a relay layer to electrically connect the light-shielding layer 404 with the capacitor electrodes 300, and the second relay layer 6a2 is a relay layer to electrically connect the pixel electrodes 9a with the first relay layer 71. Of course, these relay layers are formed as the same material as the data lines 6a.

The second interlayer insulating film 42 is formed on the storage capacitors 70 and under the data lines 6a, the shielding-layer relay layer 6a1, and the second relay layer 6a2. The second interlayer insulating film 42 may be composed of a silicate glass film, such as NSG, PSG, BSG, or BPSG, a silicon nitride film, or a silicon oxide film, as described above.

If the capacitor electrodes 300 are made of aluminum, it should be formed with low temperature by plasma CVD. In the second interlayer insulating film 42, a contact hole 801 and the contact hole 882 are formed in accordance with the shielding-layer relay layer 6a1 and the second relay layer 6a2, respectively.

In the fifth layer, the light-shielding layer 404 is formed. As in the above-described shielding layer 400, the light-shielding layer 404 may have a double layered structure including a titanium nitride layer as the top layer and an aluminum layer as the bottom layer. Alternatively, it may be formed of ITO or another conductive material. This shielding layer 404 is electrically connected to the capacitor electrodes 300 via the above-described shielding-layer relay layer 6a1. Accordingly, the shielding layer 404 is set to be a fixed potential, and as in the first exemplary embodiment, the influence of capacitive coupling generated between the pixel electrodes 9a and the data lines 6a can be eliminated.

In the fifth layer, a third relay layer 406 is formed together with the shielding layer 404 as the same film.

The third interlayer insulating film 43 is formed on the data lines 6a and under the shielding layer 404. The third interlayer insulating film 43 may be made of a material similar to the second interlayer insulating film 42. However, if the data lines 6a contain aluminum or the like as described above, the third interlayer insulating film 43 is preferably formed with low temperature by using plasma CVD in order protect the data lines 6a from a high-temperature environment.

In the third interlayer insulating film 43, a contact hole 803 to electrically connect the shielding layer 404 with the shielding-layer relay layer 6a1 is formed, and a contact hole 804 to electrically connect with the second relay layer 6a2 and corresponding to the third relay layer 406 is also formed.

In the sixth layer, the pixel electrodes 9a and the alignment film 16 are formed. The fourth interlayer insulating film 44 is formed between the sixth layer and the fifth layer. In the fourth interlayer insulating film 44, a contact hole 89 to electrically connect the pixel electrodes 9a with the third relay layer 406 is formed.

In the above-described configuration, the third relay layer 406 is directly in contact with the pixel electrodes 9a, which is made of, for example, ITO, and thus, it is vulnerable to the above-described electrolytic corrosion. In view of this point, same as in the first exemplary embodiment, the shielding layer 404 and the third relay layer 406 are preferably formed as a double layered structure including an aluminum layer and a titanium nitride layer. If the shielding layer 404 and the third relay layer 406 are formed of ITO, direct contact between aluminum and ITO can be reduced or prevented between the shielding layer 404 and the shielding-layer relay layer 6a1 and between the third relay layer 406 and the second relay layer 6a2, thereby eliminating the occurrence of electrolytic corrosion.

In the second exemplary embodiment, the capacitor electrodes 300 can be formed as part of the capacitor lines, as stated above. Accordingly, in order to set the capacitor electrodes 300 to be a fixed potential, the capacitor lines can be extended to the exterior of the image display area 10a so as to be connected to a constant potential source. In this case, the capacitor lines including the capacitor electrodes 300 can be directly connected to a constant potential source, and the shielding layer 404 can also be directly connected to a constant potential source. This eliminates the need to provide the contact holes 801 and 803 to electrically connect the capacitor electrodes 300 and the shielding layer 404. In this case, the occurrence of electrolytic corrosion does not have to be considered when selecting the materials for the shielding layer 404 and the capacitor electrodes 300 and the materials for constructing the shielding-layer relay layer 6a1 (it is not necessary to provide the shielding-layer relay layer 6a1 itself).

According to the electro-optical device of the second exemplary embodiment constructed as described above, advantages similar to those obtained by the first exemplary embodiment can be achieved. That is, as in the first exemplary embodiment, because of the provision of the grooves 12cv along the semiconductor layer 1a, the semiconductor layer 1a of the TFTs 30 can be effectively shielded from light, and thus, high-quality images without flickering can be displayed.

Specifically in the second exemplary embodiment, the silicon nitride layer 401 is formed as the top layer of the data line 6a and around the image display area 10a, moisture resistance of the TFTs 30 can be further enhanced. That is, as stated above, nitride film and nitrides can effectively reduce or prevent the entry or diffusion of water. Thus, the entry of water into the semiconductor layer 1a of the TFTs 30 can be reduced or prevented. In the second exemplary embodiment, it is possible to use nitride film for the shielding layer 404, the third relay layer 406, and the dielectric film 75 forming the storage capacitors 70. If nitride film is used for these elements, the water resistance characteristic can be effectively enhanced. It is not essential, however, that "nitride film" should be used for all the elements.

In the second exemplary embodiment, in the fourth layer, the silicon nitride layer 401 is formed only as the top layer of the data lines 6a, except around the image display area 10a, and thus, a large internal stress is not generated, which would otherwise destroy the silicon nitride film 401 due to its internal stress, and if the stress is externally applied, it would encourage the occurrence of cracks in, for example, the third interlayer insulating film 43, around the silicon nitride layer 401. This is evident if the nitride film is disposed on the entire surface of the TFT array substrate 10.

The thickness of the titanium nitride layer 41TN and the silicon nitride layer 401 in the second exemplary embodiment is formed to be relatively small, such as 10 to 100 nm, and more preferably, 10 to 30 nm. Accordingly, the above-described advantages can be further effectively enjoyed.

Specifically in the second exemplary embodiment, the provision of the relay electrodes 719 brings the following advantages. In FIG. 4, in order to establish electrical connection between the TFTs 30 and the pixel electrodes 9a, contact should be made on the "upper surface" of the first relay layer 71 which is a further lower layer and forming the storage capacitors 70, for example, as the contact hole 85.

In this configuration, however, in the forming step of the capacitor electrodes 300 and the dielectric film 75, etching must be performed while allowing the entirety of the first relay layer 71 positioned immediately under the capacitor electrodes 300 and the dielectric film 75 to remain. This makes the manufacturing process very difficult. In particular, when a high-dielectric-constant material is used for the dielectric film 75, as in the present invention, etching is very difficult to perform, and also, the etching rate of the capacitor electrodes 300 is different from that of the high-dielectric-constant material, thereby making the manufacturing process even more difficult. In this case, the first relay layer 71 may be penetrated by etching, and in the worst case, the capacitor electrodes 300 and the first relay layer 71 forming the storage capacitors 70 may be short-circuited.

In this exemplary embodiment, however, by providing the relay electrodes 719, electrical connection between the TFTs 30 and the pixel electrodes 9a can be established by forming an electrical connecting point on the "lower surface" of the first relay layer 71 in FIG. 18. Then, the above-described problems can be reduced or eliminated because, as shown in FIG. 18, the step for etching a film for the capacitor electrodes 300 and the dielectric film 75 while allowing the first relay layer 71 to remain is not required.

As described above, according to this exemplary embodiment, good electrical connection between the first relay layer 71 and the pixel electrodes 9a can be established without performing the above-described very difficult etching step. Such electrical connection can be implemented via the relay electrodes 719. For the same reason, according to this exemplary embodiment, the possibility of the capacitor electrodes 300 and the first relay layer 71 being short-circuited is very low. That is, the storage capacitors 70 without defects can be formed.

Specifically in the second exemplary embodiment, the capacitor electrodes 300 can be formed as part of the capacitor lines, as stated above. Accordingly, it is not necessary to provide a conductive material to set the capacitor electrode provided for each pixel to be a fixed potential. Instead, it is sufficient that each capacitor line is connected to a fixed potential source. According to this exemplary embodiment, therefore, the manufacturing process can be simplified, and the manufacturing cost can be reduced.

As in the first exemplary embodiment, the capacitor lines, including the capacitor electrodes 300, may be formed as a double layered structure consisting of an aluminum film and a polysilicon film. The capacitor lines containing an aluminum film can exhibit high electric conductivity. In such a configuration, the size of the capacitor lines, that is, the size of the storage capacitors 70 can be decreased without any special restriction. Accordingly, in the second exemplary embodiment, the aperture ratio can be increased. From another point of view, related art capacitor lines are made of a single material, such as polysilicon or WSi. Thus, if the size of the capacitor lines is decreased in order to increase the aperture ratio, crosstalk or burning occurs due to its high resistance. In the second exemplary embodiment, there are no such problems.

In this configuration, as described in the first exemplary embodiment, the aluminum film exhibits the light-reflection characteristic, and the polysilicon film exhibits the light-absorbing characteristic, and thus, the capacitor lines can also serve as a light-shielding layer. Additionally, the internal stress of such capacitor lines can be reduced compared to the internal stress occurring in the related art material used (the internal stress of aluminum is smaller than that of WSi). Thus, in this configuration, the thickness of the third interlayer insulating film 43, which is in contact with the capacitor lines can be reduced to a minimal level. As a result, miniaturization of the electro-optical device can be effectively implemented.

Overall Configuration of Electro-Optical Device

Figure 20:
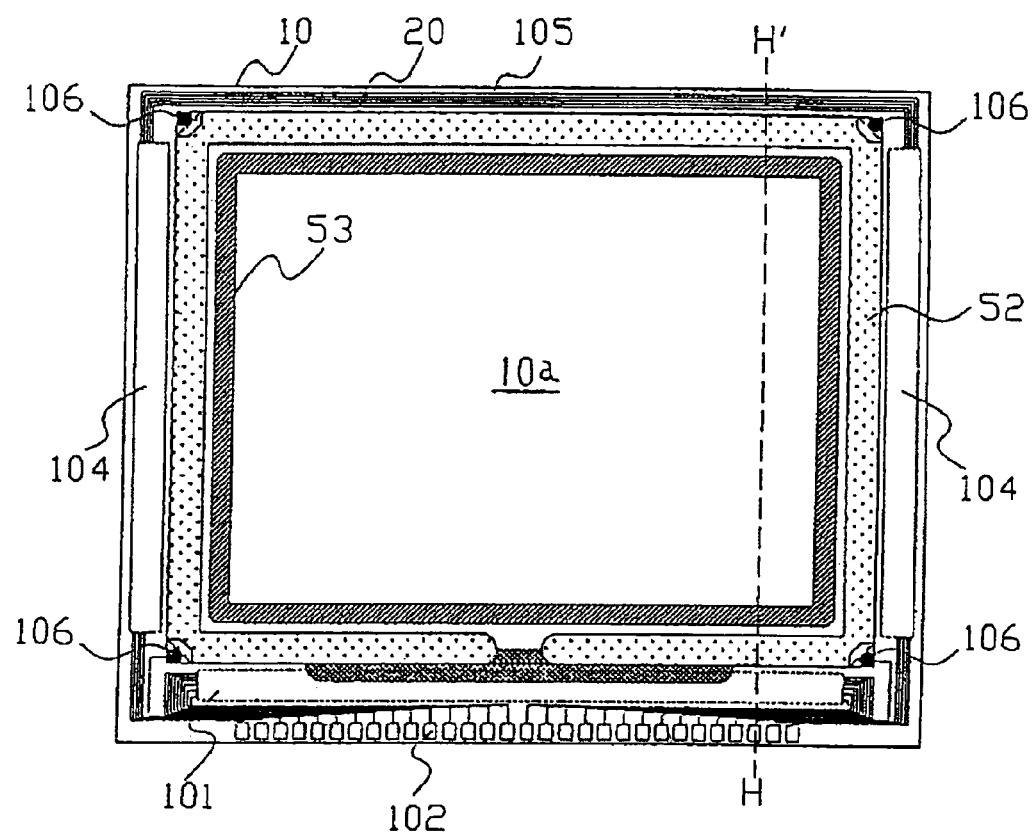
FIG. 20 is a plan view illustrating the TFT array substrate of the electro-optical device of the exemplary embodiments of the present invention together with the elements formed on the TFT array substrate as viewed from the opposing substrate.
Figure 21:
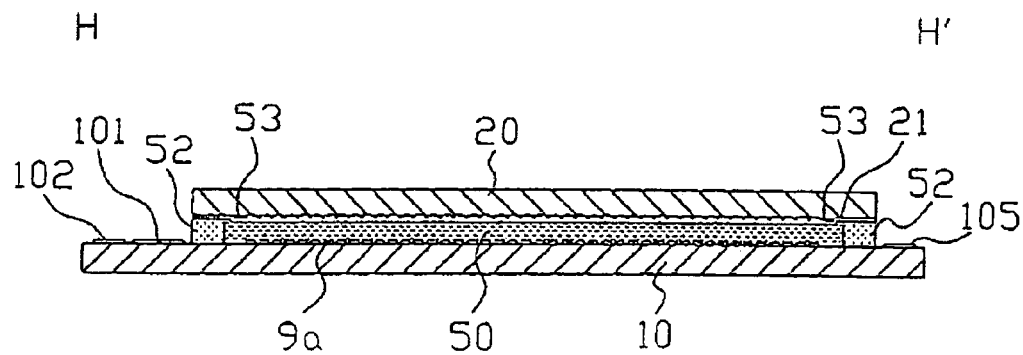
FIG. 21 is a sectional view taken along plane H–H' of FIG. 20.

The overall configuration of the electro-optical devices of the above-described exemplary embodiments is described below with reference to FIGS. 20 and 21. FIG. 20 is a plan view illustrating the TFT array substrate together with the elements formed on the TFT array substrate as viewed from the opposing substrate 20. FIG. 21 is a sectional view taken along plane H–H' of FIG. 20.

In FIGS. 20 and 21, in the electro-optical device according to the exemplary embodiments, the TFT array substrate 10 and the opposing substrate 20 face each other. The liquid crystal layer 50 is sealed between the TFT array substrate 10 and the opposing substrate 20. The TFT array substrate 10 and the opposing substrate 20 are attached to each other by a sealing material 52 disposed in a sealing area positioned around the image display area 10a.

The sealing material 52 is formed of, for example, an ultraviolet curing resin or a thermosetting resin, for laminating both the substrates, and is cured by ultraviolet rays or heat. If the liquid crystal device of the exemplary embodiments is a small, enlarge-display liquid crystal device used for a projector, a gap material (spacers), such as glass fibers or glass beads, may be dispersed in the sealing material 52 so as to set the distance between both the substrates (gap between the substrates) to be a predetermined value. If the liquid crystal device is a large, 1× magnification-display liquid crystal device, such as a liquid crystal display or a liquid crystal television, such a gap material is not contained in the liquid crystal layer 50.

Outside the sealing material 52, the data-line drive circuit 101 to drive the data lines 6a by supplying image signals to the data lines 6a with predetermined timing, and an external-circuit connecting terminal 102 are provided along one side of the TFT array substrate 10. The scanning-line drive circuits 104, to drive the scanning lines 3a by supplying scanning signals to the scanning lines 3a with predetermined timing, are provided along two sides adjacent to the side of the TFT array substrate 10 along which the data-line drive circuit 101 and the external-circuit connecting terminal 102 are disposed.

If the delay of the scanning signals supplied to the scanning lines 3a does not present a problem, the scanning-line drive circuit 104 can be provided at only one side. The data-line drive circuits 101 may be disposed at both sides of the image display area 10a.

On the remaining side of the TFT array substrate 10, a plurality of wiring patterns 105 to connect the scanning-line drive circuits 104 disposed at both sides of the image display area 10a are provided.

At least at one corner of the opposing substrate 20, a conducting material 106 to electrically connect the TFT array substrate 10 and the opposing substrate 20 is provided.

In FIG. 21, on the TFT array substrate 10, an alignment film is formed on the pixel electrodes 9a after forming wiring patterns for the pixel-switching TFTs 30, the scanning lines 3a, and the data lines 6a. On the opposing substrate 20, not only the common electrode 21, but also an alignment film is formed at the uppermost layer. The liquid crystal layer 50 is formed of one or plurality of mixed nematic liquid crystals, and the liquid crystal forms a predetermined alignment state between a pair of such alignment films.

On the TFT array substrate 10, not only the data-line drive circuit 101 and the scanning-line drive circuits 104, a sampling circuit to apply image signals to the plurality of data lines 6a with predetermined timing, a precharge circuit to supply precharge signals having a predetermined voltage level to the plurality of data lines 6a before the supply of the image signals, an inspection circuit to inspect the quality and defects of the electro-optical device while being manufactured or shipped, etc., may be formed.

Electronic Apparatus

Figure 22:
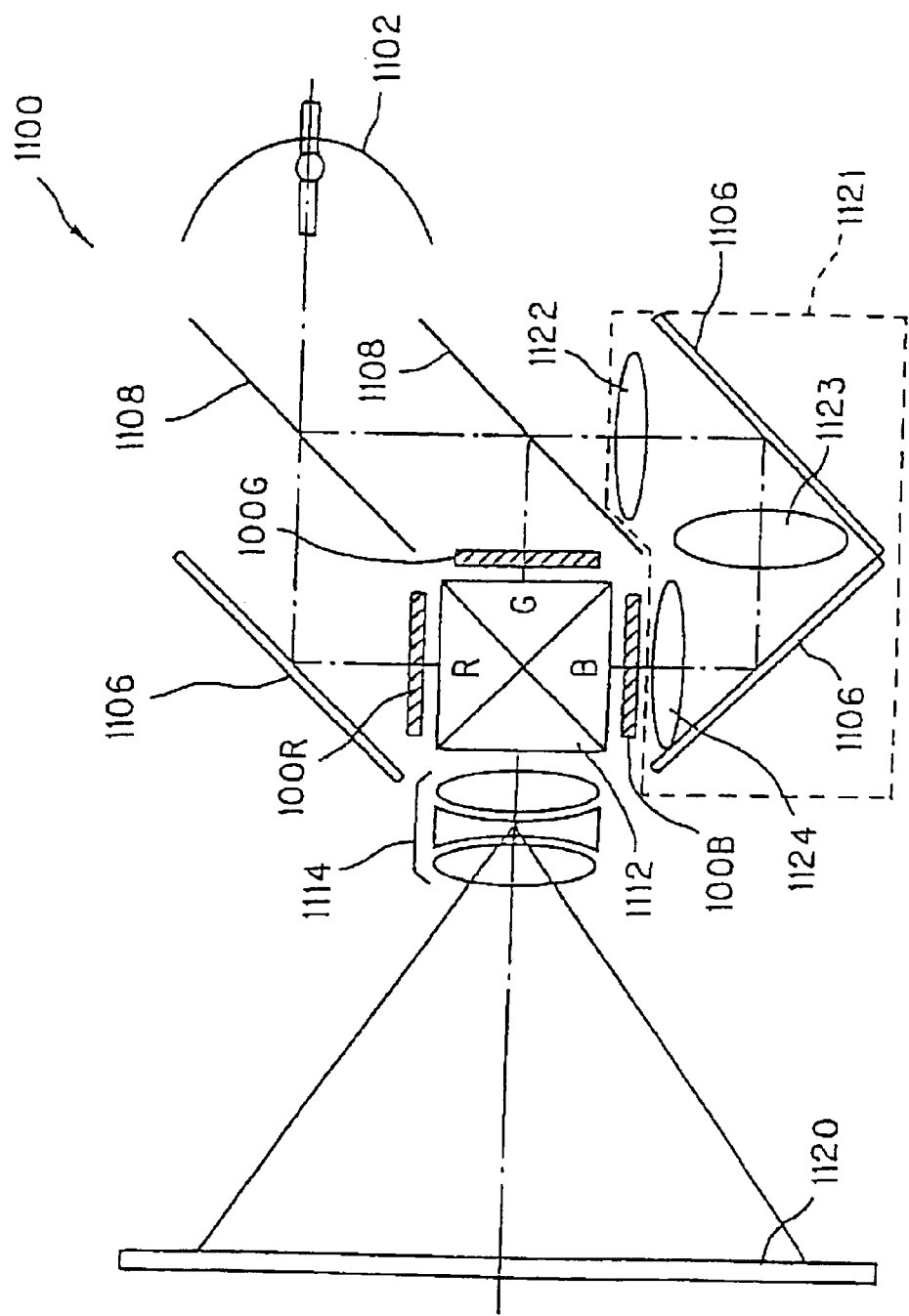
FIG. 22 is a sectional view illustrating a color liquid crystal projector, which is an example of a projection color display apparatus according to an exemplary embodiment of an electronic apparatus of the present invention.

A description is now given of the overall configuration, in particular, the configuration of an optical system of an exemplary embodiment of a projection color display apparatus, which is one example of an electronic apparatus using the above-described electro-optical device as a light valve. FIG. 22 is a sectional view illustrating the projection color display apparatus.

In FIG. 22, a liquid crystal projector 1100, which is one example of the projection color display apparatus of this exemplary embodiment, is provided with three liquid crystal modules including liquid crystal devices in which drive circuits are mounted on a TFT array substrate, i.e., with a light valve 100R, a light valve 100G, and a light valve 100B for RGB. In the liquid crystal projector 1100, projection light emitted from a lamp unit 1102, which is a white-color light source, such as a metal halide lamp, is split into light components R, G, and B corresponding to the three primary colors RGB by three mirrors 1106 and two dichroic mirrors 1108. The light components R, G, and B are then led to the light valves 100R, 100G, and 100B, respectively. In this case, the light component B is led to the light valve 100B via a relay lens system 1121 including an incoming lens 1122, a relay lens 1123, and an outgoing lens 1124 in order to reduce or prevent light loss caused by a long optical path. Then, the light components corresponding to the three primary colors modulated by the light valves 100R, 100G, and 100B are combined by a dichroic prism 1112, and the synthesized light is projected on a screen 1120 via a projection lens 1114 as a color image.

The present invention is not restricted to the above-described exemplary embodiments, and it may be changed within the scope of the claims and the entire specification or without departing from the spirit of the invention. Modified electro-optical devices and electronic apparatuses are also included in the technical field of the present invention. The electro-optical devices can be used as electrophoretic devices, EL (electroluminescent) devices, devices using electron emission elements (field emission display and surface-conduction electron-emitter display).

What is claimed is:

1. An electro-optical device, comprising:
data lines extending in a first direction above a substrate;
scanning lines extending in a second direction and intersecting with the data lines;
pixel electrodes and thin film transistors disposed corresponding to intersections of the data lines and the scanning lines;
storage capacitors electrically connected to the thin film transistors and the pixel electrodes; and
a shielding layer disposed between the data lines and the pixel electrodes, one of a pair of electrodes forming each of the storage capacitors being formed of a multi-layered film containing a low resistance film, and
each of the thin film transistors comprising:
a semiconductor layer including a channel region extending in the longitudinal direction;
an upper light-shielding film to cover the channel region of the thin film transistor at least from the top is provided; and
the upper light-shielding film being at least partially formed in a recessed shape, as viewed from the channel region, in cross section orthogonal to the longitudinal direction of the channel region.

2. An electro-optical device, comprising:
data lines extending in a first direction above a substrate;
scanning lines extending in a second direction and intersecting with the data lines;
pixel electrodes and thin film transistors disposed corresponding to intersections of the data lines and the scanning lines;
storage capacitors electrically connected to the thin film transistors and the pixel electrodes; and
a shielding layer disposed between the data lines and the pixel electrodes,
one of a pair of electrodes forming each of the storage capacitors being formed of a multi-layered film containing a low resistance film,
each of the thin film transistors including a semiconductor layer including a channel region extending in the first direction,
each of the scanning lines including a main portion having a gate electrode of the thin film transistor disposed to face the channel region with a gate insulating film therebetween and extending in the second direction intersecting with the first direction when viewed from the top, and
the main portion being disposed in a groove formed in the substrate, and also including an in-groove portion to cover at least part of the channel region from the sides.

3. An electro-optical device, comprising:
data lines extending in a first direction above a substrate;
scanning lines extending in a second direction and intersecting with the data lines;
pixel electrodes and thin film transistors disposed corresponding to intersections of the data lines and the scanning lines;
storage capacitors electrically connected to the thin film transistors and the pixel electrodes; and
a shielding layer disposed between the data lines and the pixel electrodes,
one of a pair of electrodes forming each of the storage capacitors being formed of a multi-layered film containing a low resistance film,
at least part of the scanning lines, the data lines, the pair of electrodes forming the storage capacitor, and the shielding layer being formed of a light-shielding material, and
said at least part of the scanning lines, the data lines, the pair of electrodes forming the storage capacitor, and the shielding layer forming a built-in light-shielding film in a laminated structure.

4. The electro-optical device according to claim 3, the multi-layered film being formed of a light-absorbing film as a bottom layer and a light-reflecting film as a top layer.

5. The electro-optical device according to claim 4, the multi-layered film being together with the data lines as the same film.

6. The electro-optical device according to claim 3,
one of the pair of electrodes forming each of the storage capacitors forms part of a capacitor line formed in the second direction; and
the capacitor line being formed of a multi-layered film containing a low resistance film.

7. The electro-optical device according to claim 3, the multi-layered film being together with the data lines as the same film.

8. The electro-optical device according to claim 3, the low resistance film being made of aluminum.

9. The electro-optical device according to claim 3, each of the thin film transistors comprising:
a semiconductor layer including a channel region extending in the longitudinal direction and channel adjacent regions extending in the longitudinal direction further from the channel region, and a light-shielding portion is provided at both sides of the channel region.

10. The electro-optical device according to claim 9, each of the scanning lines comprising:
   a main portion extending in a direction intersecting with the longitudinal direction and including a gate electrode of the thin film transistor overlapping with the channel region when viewed from the top; and horizontal projections extending in the longitudinal direction from the main portion at both sides of the channel region when viewed from the top so as to form the light-shielding portion.

11. The electro-optical device according to claim 10, the main portion at which the gate electrode being provided is formed wider.

12. The electro-optical device according to claim 10, the horizontal projections extending from both sides of the channel adjacent regions that are positioned at source and drain sides of the channel region when viewed from the top.

13. The electro-optical device according to claim 10, the scanning line further comprising:
   a vertical projection extending in the vertical direction of the substrate from the main portion at a position away from the channel region in the second direction by a predetermined distance.

14. The electro-optical device according to claim 13:
   a lower light-shielding film to cover the channel region at least from the bottom being further provided on the substrate; and
   the top of the vertical projection being in contact with the lower light-shielding film.

15. The electro-optical device according to claim 3, each of the thin film transistors comprising:
   a semiconductor layer including a channel region extending in the longitudinal direction;
   an upper light-shielding film to cover the channel region of the thin film transistor at least from the top is provided; and
   the upper light-shielding film being at least partially formed in a recessed shape, as viewed from the channel region, in cross section orthogonal to the longitudinal direction of the channel region.

16. The electro-optical device according to claim 3,
   each of the thin film transistors including a semiconductor layer including a channel region extending in the first direction;
   each of the scanning lines including a main portion having a gate electrode of the thin film transistor disposed to face the channel region with a gate insulating film therebetween and extending in the second direction intersecting with the first direction when viewed from the top; and
   the main portion being disposed in a groove formed in the substrate, and also including an in-groove portion to cover at least part of the channel region from the sides.

* * * * *